(12) United States Patent
Barnett et al.

(10) Patent No.: US 11,183,879 B1
(45) Date of Patent: *Nov. 23, 2021

(54) METHOD AND SYSTEM FOR BUILDING AN ELECTRICAL GRID TOPOLOGY AND IDENTIFYING FAULTS IN AN ELECTRICAL GRID

(71) Applicant: Elintrix, Escondido, CA (US)

(72) Inventors: Alan Drew Barnett, Escondido, CA (US); Joseph Robert Reed, Escondido, CA (US)

(73) Assignee: Elintrix, Escondido, CA (US)

( * ) Notice: Subject to any disclaimer, the term of this patent is extended or adjusted under 35 U.S.C. 154(b) by 225 days.

This patent is subject to a terminal disclaimer.

(21) Appl. No.: 16/450,952

(22) Filed: Jun. 24, 2019

Related U.S. Application Data

(63) Continuation-in-part of application No. 15/072,348, filed on Mar. 16, 2016, now Pat. No. 10,330,812.

(60) Provisional application No. 62/133,878, filed on Mar. 16, 2015.

(51) Int. Cl.
| | |
|---|---|
| *G01R 19/14* | (2006.01) |
| *G01V 3/08* | (2006.01) |
| *H02J 13/00* | (2006.01) |
| *H02J 3/38* | (2006.01) |

(52) U.S. Cl.
CPC ......... *H02J 13/0079* (2013.01); *G01R 19/14* (2013.01); *H02J 3/38* (2013.01)

(58) Field of Classification Search
CPC ........ G01V 3/08; G01R 19/14; G01R 31/085; G01R 31/086; G01R 31/318575; H02J 3/00; H02J 13/00; H02J 13/0013; H02J 13/0017; H02J 13/0062; H02J 13/0058; G01D 21/00
See application file for complete search history.

(56) References Cited

U.S. PATENT DOCUMENTS

| | | | |
|---|---|---|---|
| 8,461,823 | B2 | 6/2013 | Buda |
| 2005/0083206 | A1 | 4/2005 | Couch et al. |
| 2011/0010118 | A1 | 1/2011 | Gaarder |
| 2012/0265355 | A1 | 10/2012 | Bernheim et al. |
| 2014/0368189 | A1 | 12/2014 | Bernheim et al. |

*Primary Examiner* — Son T Le
(74) *Attorney, Agent, or Firm* — Insigne PC

(57) ABSTRACT

Exemplary methods and systems for building an electrical grid topology and detecting faults in an electrical grid are disclosed herein. In an exemplary embodiment, a method for building an electrical grid topology of an electrical grid comprising a plurality of grid elements, the method comprises sending, from a first signaling module of a plurality of signaling modules of the electrical grid, a mapping signal; receiving, at a second signaling module of the plurality of signaling modules, the mapping signal; and deriving, from the mapping signal, grid characteristics of the electrical grid; wherein the grid characteristics are derived from the mapping signal based on the influence that one or more of the plurality of grid elements has on the mapping signal.

22 Claims, 10 Drawing Sheets

METHOD AND SYSTEM FOR BUILDING AN ELECTRICAL GRID TOPOLOGY AND IDENTIFYING FAULTS IN AN ELECTRICAL GRID

CROSS-REFERENCE TO RELATED APPLICATIONS

This application is a continuation-in-part of U.S. application Ser. No. 15/072,348, filed Mar. 3, 2016, which claims priority to U.S. Provisional Patent Application No. 62/133,878, filed Mar. 16, 2015, each of which is fully incorporated by reference herein.

BACKGROUND OF THE INVENTION

1. Field of Invention

This invention relates to electricity distribution and more particularly to a method and system for identifying faults occurring in an electrical grid.

2. Description of Related Art

An electrical grid (or electric grid) is a network of synchronized power providers and consumers that are connected by distribution lines and operated by one or more control centers (or grid operators). Optimal operation of an electrical grid, particularly one that is geographically extensive, requires maintaining near real-time knowledge of the electrical schematic and geographic route (topology) of the distribution lines. Large grids, such as those employed by electrical utilities and others, are constructed to enable the ability to dynamically switch the distribution lines that supply a particular geographic region, device, or load for operational purposes. The changes in the grid schematic and topology that result from such switching are frequently not available to the grid operator, in a timely manner. Yet, such knowledge is vital to optimal operation of the grid, maintaining uninterrupted power through informed decision-making, and prompt identification and localization of distribution failures. A lack of prior knowledge about static connectivity and/or dynamic switching confound a simple attempt at one-time mapping to show which distribution line is servicing a particular geographic area or specific point on the grid. Detailed knowledge provided by schematic and topological awareness enables the most effective use of resources under conditions of changing demand, the need for rapid detection and location of grid failures, performing maintenance, and for timely execution of restorative action, following, for example, an unplanned outage. The fundamental problem of grid schematic mapping is determining what substation, bus, feeder, and phase supplies a particular demand.

Prior art approaches to determine electrical connectivity between loads and electrical supply lines (feeders) transmit special signals from a signaling device directly through a power line, which are analyzed to discover the identity of the respective power line (feeder-phase conductor) through which the signaling device is communicating, at the time of transmission. Such signals also include messages that contain geolocation information of the transmitter, such as a pre-programmed street address or geographic coordinates, or geographic coordinates obtained from an integrated global positioning system (GPS) receiver, and other information to be reported by the signal. The geolocation of the signal source is essential to developing topological information about the grid. Then, at a receiver, metrics such as signal strength, bit-error-rate (BER), and signal quality are used to infer schematic-connectivity between individual signaling-sources (associated with particular points or loads on the grid) and specific conductors of individual feeders. However, a BER metric may be of limited value, particularly in cases where the noise present on a feeder-phase conductor at the measurement point is high, relative to the strength of the signal. Furthermore, assessment of signal quality typically involves the use of mathematical algorithms, operating on received signals. This adds to the computational burden of methods that employ such metrics, potentially increasing hardware requirements and associated penalties, such as cost. Moreover, a transmitted signal can be detected on conductors other than the one(s) over which it was actually transmitted. In prior art, this has been erroneously attributed to mechanisms such as "crosstalk" and "reflections."

United States Patent Application Publication No. 2015/0010093 to Hansell et al. and International Patent Publication WO2014130366 to Hansell et al., the disclosures of which are incorporated herein by reference in their entirety, teach an on-grid transmitter that transmits a probe transmission onto a low-voltage power line at an electrical meter. An on-grid receiver is located at an electrical distribution substation and configured to monitor all three phases of one or more voltage feeders. The receiver continuously digitizes and records the signal on all monitored power lines, sampling the recorded signal and attempting to recognize a probe transmission. The receiver infers the phase and the feeder on which the transmitter injected the probe transmission based on received-signal strength, signal quality, message bit-error-rate and timing-relationship to the zero-crossings of the sixty (60) Hz power signal. The reliability of metrics that make use of probe transmissions referenced to the zero-crossings of the power signal that is present at a distant transmission point on the grid depends on resolving phase-shifts that may occur, such as those in which a transformer winding is delta-configured, along the signal path. Unless the specific phase-shifts that occur in the path are known ahead of time, the metric can be of marginal value in resolving which feeder-phase is serving the signal origination-point. Such techniques also fail to recognize the value of signal polarity and/or current ingress/egress relationships at the current transformers attached to power-bearing conductors within a substation.

Practical benefits of having accurate distribution circuit maps include, but are not limited to, reductions in losses in the grid, load and phase balancing, reduced outage time, improved reliability, improved safety, asset protection, trend determination, and theft detection. It is desirable to have real-time or near real-time information that allows utilities to accurately determine distribution schematic information.

SUMMARY OF THE INVENTION

The present invention overcomes these and other deficiencies of the prior art by providing an improved method of identifying which electrical conductor is supplying a signaling-point that is located on that conductor, in the electrical grid. The present invention makes the identification by measuring currents flowing into and out of a common connection-point, such as a power bus, and analyzing concurrent portions of these currents to determine whether they are ingress-current or egress-current over the analysis-intervals, and by a subsequent intra-bus and inter-bus analysis of the ingress/egress patterns. This is in contrast to prior art systems that rely on the measurement of signal strength, an approach that does not take best advantage of information in the signal because it fails to consider polarity of instantaneous voltages, reflective of the direction of current flow, or the intra-bus and inter-bus ingress/egress current-relationships.

The present invention eliminates the need for special calculations, such as assessment of signal quality, bit-error-rate (BER) and special transmission-measurements, such as establishing timing-relationships between transmissions and zero-crossing events. The present invention detects the presence of certain types of phase-shifting due to transformer winding-configuration, such as in the case of a delta-wye, solely by observation of the ingress/egress relationships exposed by the intra-bus and inter-bus analyses. Alternatively, phase-shift present at a signaling module may be computed using a time-stamped measurement of the instantaneous phase, communicated to a pathfinder module. But, this metric is not necessary to the invention's capability of discovering feeder-phase/signaling-point association. Accurate time is provided by a GPS receiver that is integrated into the signaling module. This accurate time-base is also used to facilitate the use of channel-access methods, such as Time-Division Multiple Access (TDMA) in the communication of signaling-module transmissions, but other sources of system-time, such as may be distributed by the system or obtained from private or commercial networks may be used. By comparison with prior art methods, the present invention is less computationally-burdensome, resulting in reduced hardware requirements and lower-cost receiving/processing platforms.

Furthermore, the present invention identifies feeder-phase conductors of the same phase that are operated in parallel ("networked") supplying a particular signaling-point on the grid. In some cases of grid architecture, this is made possible by monitoring the conductors that supply power from the distribution transformer(s) to the buses to which feeders are attached, in addition to monitoring the individual feeder-conductors that supply the service area of the distribution substation. It is a distinguishing feature of the present invention that all conductors attached to common connection-points, such as buses, are to be used to provide reliable disambiguation such as in cases where only two feeders are attached to a power-distribution bus.

In an embodiment of the invention, remote signaling-devices send special signals and messages from installation points on the electrical grid that are digitized and processed by a receiving unit that is located at an electrical distribution substation or similar installation.

In an embodiment of the invention, the information used to develop an electrical schematic and topological mapping principally comprises: 1) geographic location of a remote signal-device and; 2) identification of the electrical feeder conductor(s) over which a signal from the remote signal-device is being sent. The latter is equivalent to discovering the electrical, feeder-phase conductor(s) responsible for supplying power to the point on the grid where the signaling-device is introducing the transmitted signal.

The prior art has not recognized the utility of the comparison of instantaneous (sampled) signal-polarity or cross-comparison and analyses of instantaneous (sampled), or integrated (cross-correlated samples) ingress and egress currents in the feeder-phase conductors, relative to a common reference point, such as the power-distribution bus on which such feeder-conductors are terminated at an electrical distribution substation. The use of such signal polarities and ingress/egress current analyses represent a new, unique, non-obvious, and robust method for use in identifying associations between the points on the grid at which tracing signals are introduced by a signaling-device and the feeder-phase conductor(s) being used to supply that point, at the time the signal was received. In cases where the signal-to-noise ratio (SNR) of a received signal is too low, determination of the direction of signal flow from individual, instantaneous current measurements may be unacceptably degraded. In this case, the invention employs a unique series of symbols in the preamble portion of the transmitted signal. At the receiver, a copy of this known, unique waveform is cross-correlated with the sampled, current-transformer signals. The cross-correlation takes advantage of all of the energy in the preamble samples and the resulting polarity of the cross-correlation peak reveals the direction of current flow. Alternatively, the invention may employ analyses of the polarity of the received signals at multiple time-aligned intervals to increase the reliability of the ingress vs. egress classifications. In addition to being constructed to facilitate robust determination of the direction of current flow by the receiver, the preamble is also constructed to provide a means of frequency- and timing-synchronization of the receiver, consistent with standard practices in digital communications.

A method for identifying a signaling conductor in an electrical grid comprising a three-phase electrical power supply station and a number (N) of distribution feeders, N is greater than or equal to three, the three-phase power supply station comprising an A phase power bus, a B phase power bus, and a C phase power bus, and the signaling conductor supplying a signal generated by a signaling module coupled to the signaling conductor, the method comprises the steps: determining, at the A phase power bus, a direction of current flow relative to the A phase power bus of each distribution feeder; determining, at the B phase power bus, a direction of current flow relative to the B phase power bus of each distribution feeder; determining, at the C phase power bus, a direction of current flow relative to the C phase power bus of each distribution feeder, analyzing current flow patterns among the N number of distribution feeders to identify one of the distribution feeders as a signaling distribution feeder; analyzing current flow patterns among the A phase power bus, the B phase power bus, and the C phase power bus, to identify one of the A phase power bus, the B phase power bus, or the C phase power bus as a signaling phase power bus; and identifying a signaling conductor common to both the identified signaling distribution feeder and the identified signaling phase power bus, wherein the signaling conductor is a conductor supplying the signal from the signaling module. The step of analyzing current flow patterns among the N number of distribution feeder to identify one of the distribution feeder as a signaling distribution feeder comprises the step of: comparing a current flow pattern of each distribution feeder to one another to identify a unique current flow pattern. The step of analyzing current flow patterns among the A phase power bus, the B phase power bus, and the C phase power bus, to identify one of the A phase power bus, the B phase power bus, or the C phase power bus as a signaling phase power bus comprises the step of: comparing a current flow pattern of the A phase power bus, the B phase power bus, and the C phase power bus to one another to identify a unique current flow pattern. The method may further comprise the steps of receiving, via the signaling conductor, the signal supplied by the signaling module, wherein the signal comprises geo-location information and building a schematic connectivity and topology of the electrical grid. The signaling module is located at a node in the electrical grid, the node selected from the group consisting of: a transformer, a switch, a power meter, an outlet, a motor, machinery and other electrical power-consuming equipment.

In another embodiment of the invention, a method for identifying a signaling conductor in an electrical grid comprising a three-phase electrical power supply station and a number (N) of distribution feeders, the three-phase power supply station comprising an A phase power bus, a B phase power bus, a C phase power bus, and a distribution transformer, and the signaling conductor supplying a signal generated by a signaling module coupled to the signaling conductor, the method comprises the steps: determining, at the A phase power bus, a direction of current flow relative to the A phase power bus of a first conductor coupled to a distribution transformer; determining, at the B phase power bus, a direction of current flow relative to the B phase power bus of a second conductor coupled to the distribution transformer; determining, at the C phase power bus, a direction of current flow relative to the C phase power bus of a third conductor coupled to the distribution transformer, identifying one of the first conductor, the second conductor, or the third conductor as a signaling conductor; determining, at the A phase power bus, B phase power bus, or C phase power bus, whichever is associated with the identified signaling conductor, a direction of current flow relative to that phase power bus of each distribution feeder; identifying the distribution feeder having a determined direction of current flow opposite that of the signaling conductor; and wherein the identified distribution feeder is the signaling conductor supplying the signal from the signaling module. The step of identifying one of the first conductor, the second conductor, or the third conductor as a signaling conductor comprises the step of: comparing the measured direction of current flow pattern of the first conductor, second conductor, and third conductor to one another to identify a unique current flow direction. The method may further comprise the steps of: receiving, via the signaling conductor, the signal supplied by the signaling module, wherein the signal comprises geo-location information and building a schematic connectivity and topology of the electrical grid. The signaling module is located at a node in the electrical grid, the node selected from the group consisting of: a transformer, a switch, a power meter, and an outlet.

In an exemplary embodiment, the present disclosure comprises a method for building an electrical grid topology of an electrical grid comprising a plurality of grid elements, the method comprising sending, from a first signaling module of a plurality of signaling modules of the electrical grid, a mapping signal; receiving, at a second signaling module of the plurality of signaling modules, the mapping signal; and deriving, from the mapping signal, grid characteristics of the electrical grid; wherein the grid characteristics are derived from the mapping signal based on the influence that one or more of the plurality of grid elements has on the mapping signal.

In other embodiments of the present disclosure, the grid characteristics further comprise the impulse response as measured between the first signaling module of the plurality of signaling modules and the second signaling module of the plurality of signaling modules.

In other embodiments of the present disclosure, the mapping signal comprises an identifier associated with the first signaling module.

In other embodiments of the present disclosure, the identifier comprises a preamble of one or more sequences of modulated information bits.

In other embodiments of the present disclosure, the method further comprising the steps of receiving, at each of the plurality of signaling modules, the mapping signal sent by the first signaling module; and deriving, from the mapping signal, grid characteristics of the electrical grid as detected between the first signaling module and each of the plurality of signaling modules.

In other embodiments of the present disclosure, each of the plurality of signaling modules are further configured to measure characteristics of the grid element on which they are installed.

In other embodiments of the present disclosure, each of the plurality signaling modules are further configured to measure aspects of its surrounding environment.

In other embodiments of the present disclosure, the method further comprises the step of sending, from the first signaling module of the plurality of signaling modules, a communication signal across the electrical grid.

In other embodiments of the present disclosure, the communication signal comprises a first fragmentation of a plurality of signal fragments derived from a communication, and wherein a second fragmentation of the plurality of signal fragments is sent over a network other than the electrical grid.

In other embodiments of the present disclosure, the mapping signal and the communication signal are the same signal.

In another exemplary embodiment, the present disclosure comprises a method for detecting faults in an electrical grid comprising a plurality of grid elements, the method comprising sending, from a first signaling module of a plurality of signaling modules, a mapping signal; receiving, at a second signaling module of the plurality of signaling modules, the mapping signal; deriving, from the mapping signal, grid characteristics of the electrical grid; and comparing the derived grid characteristics of the electrical grid against historical data; wherein the grid characteristics are derived from the mapping signal based on the influence that one or more of the plurality of grid elements has on the mapping signal; and wherein a fault is detected when the derived grid characteristics of the electrical grid exceed a predetermined threshold compared to historical data.

An advantage of the invention is that it provides a technique for efficiently and accurately determining electrical-grid schematic and topological properties, identifying and reporting electrical and infrastructure events, and making this information available in useful formats, such as databases, maps and/or tables. Schematic and topological awareness provides a variety of benefits, such as, but not limited to enabling optimizations essential to "smart grid" operations; maintenance of uninterrupted power; informed decision-making, allowing assessment of contemplated, operational scenarios; near-real-time identification and localization of distribution failures; making possible the best use of resources in performing maintenance; and ensuring efficiency and effectiveness in the execution of post-disaster service-restoration.

The foregoing, and other features and advantages of the invention, will be apparent from the following, more particular description of the preferred embodiments of the invention, the accompanying drawings, and the claims.

BRIEF DESCRIPTION OF THE DRAWINGS

For a more complete understanding of the present invention, the objects and advantages thereof, reference is now made to the ensuing descriptions taken in connection with the accompanying drawings briefly described as follows.

DETAILED DESCRIPTION OF EMBODIMENTS

Figure 1:
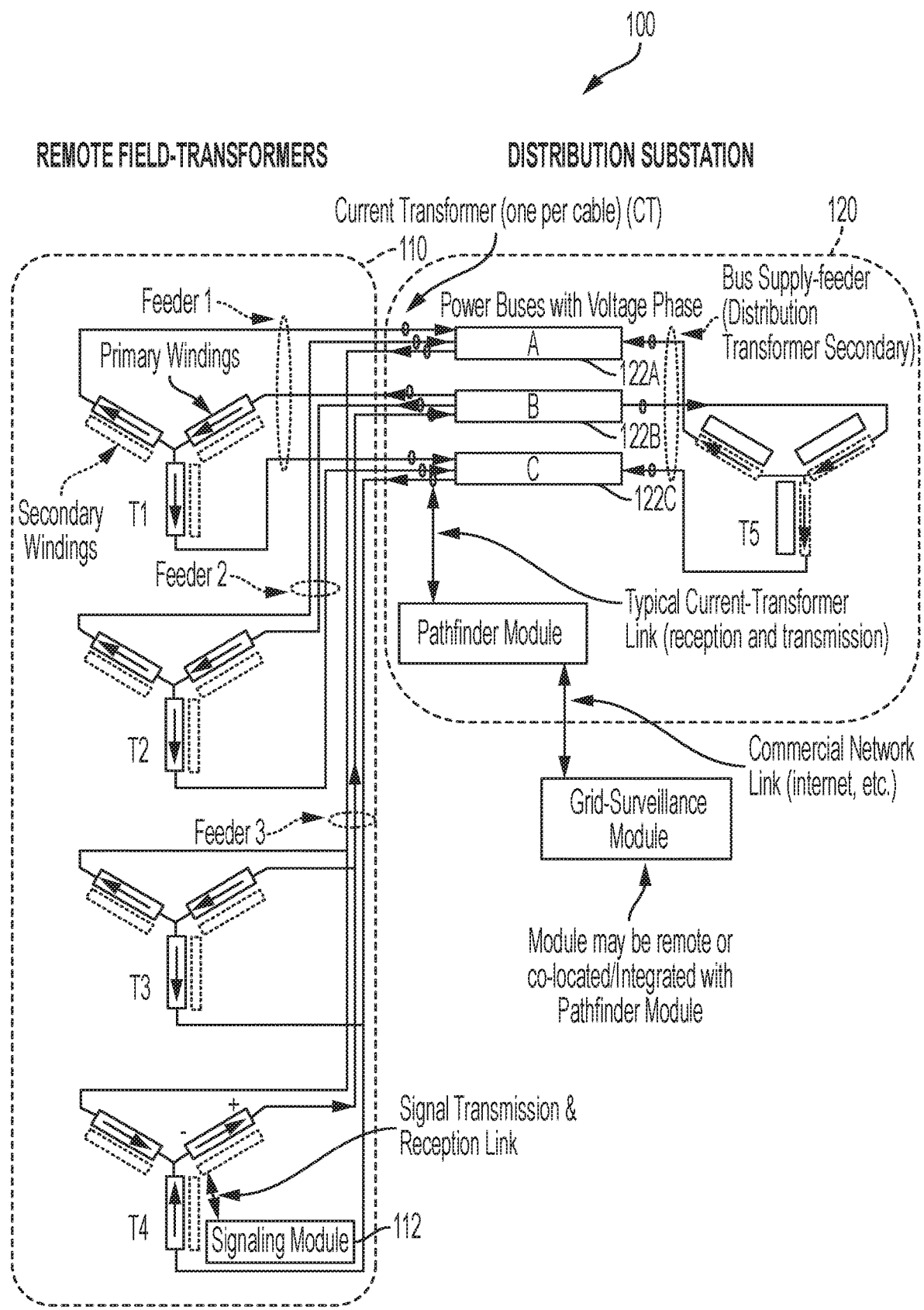
FIG. 1 illustrates an electrical grid system according to an exemplary embodiment of the invention.

Preferred embodiments of the present invention and their advantages may be understood by referring to FIGS. 1-9, wherein like reference numerals refer to like elements. Although the present invention is described in the context of an electric or power grid, one of ordinary skill in the art readily appreciates that the concepts described herein can be applied to any type of electricity supply, or signaling, network distributing electrical power, or signals.

The current invention recognizes that "crosstalk" and "reflections" are not the cause of signals and messages appearing on feeders other than the one on which the signal was transmitted as taught in the prior art. Rather, the signals are correctly attributable to the natural flow of signal current though other conductors that complete paths back to an originating transformer-winding. The present invention leverages this insight to result in a more robust and reliable method of determining which feeder-phase(s) is/are the one(s) on which the signal was transmitted and which feeder-phase signals are not correct choices. This provides a heretofore unrecognized means of disambiguation of feeder/load relationships in so-called "networked" grids in which a load may be fed by more than one set of feeder conductors.

The present invention introduces the use of comparative analysis of the signed amplitude (polarity) of signals and ingress/egress classification of currents on all conductors attached to each power-bus to robustly discover and disambiguate the conductor(s) supplying the site of the signaling-device. Such observations can be conveniently made through the use of current transformers, installed on the individual conductors, near the common points of origination, typically a power bus, but any current-sensor serving the same purpose can be used. The present invention does not require sophisticated signal-analysis methods, as do prior art solutions that employ derived metrics such as signal quality. Thus, the present invention reduces the computational burden and associated hardware complexity required by the approaches used in prior art. Further, the method does not require the use of derived metrics employed in the prior art, such as bit-error-rate, to aid in making accurate discovery of load/feeder connections. Moreover, the presence of certain types of transformer winding-configurations is exposed by transmissions of signals that are specially timed, relative to zero-crossings of the power-signal is irrelevant in the present invention. Without such special synchronization, and by operating on the ingress/egress currents that are present and available at the substation distribution bus, the present invention discovers and reports such transformer winding-configuration information.

In an embodiment of the invention, the present invention comprises grid-deployed Signaling Modules, a distribution substation Pathfinder Module, and a Grid-Surveillance Module. Signaling Modules operate to introduce a signal onto the electrical distribution grid at locations remote from the distribution substation, such as, but not limited to a transformer, switch, power meter or outlet. The Pathfinder Module receives and uses the signal to infer the feeder-phase/signaling-module associations, thereby enabling derivation of the electrical-grid schematic and topological properties. In an embodiment of the invention, the Signal Modules and Pathfinder Module communicate using integrated, Power Line Communication (PLC) modem technology, the implementation of which is apparent to one of ordinary skill in the art. Communications between the Pathfinder Module and the Grid-surveillance module may be via a local connection, a wireless network or other commercial, communication system, the implementation and identification of which are apparent to one of ordinary skill in the art. The Pathfinder Module determines whether currents are ingress currents or egress currents, relative to the bus on which the monitored electrical cable is attached. From this information and GPS, or pre-programmed, geo-location information that is embedded in the arriving signal, the schematic and topology of the grid can be determined. Such determination is accomplished by the Grid-Surveillance Module, using stored maps, information discovered by the system, and available, as-built knowledge of the grid infrastructure.

In an embodiment of the invention, the initial portion of the transmitted signal comprises a preamble consisting of one, or more, sequences of modulated information-bits. As is exemplar of modulated bit-streams in digital communications, these modulated bits result in a sequence of symbols. By thoughtful construction of the sequence of information bits that are modulated, the resulting waveform, received by the Pathfinder Module, can be operated upon to obtain useful information, such as the unique identification of the originating signal or, in the case of Signaling Modules that may perform as trans-modulation or relay devices for signals originating elsewhere on the grid, the sequence of unique identifiers comprising a signaling route. This information can have significant value, for instance in the construction of a signal-routing diagram that may be used to manage the communications network, enhance the ability to form grid schematic/topological maps or reveal information about grid characteristics that are reflected in the weighted metrics used to configure an ad hoc network architecture.

For example, pseudo-random bit sequences can be modulated to form a preamble that, when cross-correlated with this known preamble-signal, at the Pathfinder Module, will provide a means of uniquely identifying the originating Signal Module. This method is in contrast to simply including an address in the message portion of the signal. The aggregation of signal energy by the cross-correlation operation provides a means of identifying the Signal Module that is particularly useful when low SNR conditions might otherwise disrupt the ability to extract the identification from the message portion of the transmitted signal. This capability is relevant to achieving robust, accurate differentiation and proper classification of ingress and egress currents, for example in systems where asynchronous CDMA channel-access methods may be employed and transmissions may overlap, in time. Symbol-timing synchronization and enabling characterization of, and compensation for, certain channel degradation-effects are other benefits of the pre-amble portion of the packet transmission. This method is exemplar and not intended to limit the invention to the use of pseudo-random sequences for identification of any element or device that sends signals over the system or exclude the use of methods taught in prior art.

As regularly used in packet-transmission designs, the peak of the cross-correlation result will also be used as a reference for accurate time-localization of the beginning of the message-data samples. This provides for a reduced computational work-load on the receivers, when detecting and synchronizing with the message symbols.

Embodiments of the system may employ Direct Sequence Spread Spectrum (DSSS) and Code Division Multiple Access (CDMA) techniques. Such methods provide a degree of privacy, combat certain forms of signal-degradation and, in the case of CDMA, relax transmission-synchronization requirements and enable multiple communication devices to simultaneously access the communication channel without undue interference to each other. Other embodiments of the invention will employ Frequency Division Multiple Access (FDMA) or Time Division Multiple Access (TDMA) to manage access to the channel and prevent packet collisions. Established methods of source coding/decoding, encryption/decryption, modulation/demodulation, channel coding/decoding, synchronization, multiplexing, multiple-access and spread spectrum techniques that are well-known to those skilled in the art may be utilized in embodiments of the invention, as necessitated by factors such as grid characteristics and user requirements.

In other embodiments of the invention, the present invention employs bi-directional communications between the Pathfinder Module and the Signaling Module. Also, bi-directional communication between Pathfinder Modules and Grid-surveillance occurs and embodiments of the invention may involve bi-directional communication between multiple Pathfinder Modules and a single Grid-surveillance Module. Other embodiments may provide for bi-directional communication between multiple Grid-surveillance Modules. Signaling Modules may incorporate modulation/demodulation capability to facilitate bi-directional communication with other Signaling Modules and with the Pathfinder Module. This supports ad hoc network-formation, to facilitate transmission of information over greater distances.

Those skilled in the art will recognize that electrical signals may be placed on, or recovered from, electrical grids by using conducted (contact) or radiated (non-contact) methods.

In one embodiment, a signal applied to the secondary winding of a transformer, the primary winding of which is connected between power-line conductors, will result in the appearance of the signal on the primary winding and on the associated grid conductors. Conversely, signals arriving at the primary winding of a transformer will appear on the secondary winding, facilitating digitization and subsequent processing. In this example, transformer-coupling to the grid provides for omni- or bi-directional transmission and reception.

In another embodiment, signals are induced onto a line via a current transformer, the leads of which are driven by a transmitting device. To recover the transmitted signal at the receiver, non-contact transducers, such as another current transformer or voltage detector can be employed.

In another embodiment, the signal to be transmitted is applied to an electrically-variable load, causing the load to draw power from the grid in a way that replicates the modulating signal. This is an example of a conducted method of signal injection. Other means include electrical filters which provide a means of directly applying signal to, or recovering them from, the electrical grid.

In an embodiment of the invention, the Signaling Modules include additional sensing capability, beyond the ability to measure current and voltage. This includes determination and transmission of grid power-signal characteristics that may be time-stamped, using resources such as GPS-based time reference, or some other time reference that is available to the signaling module. Such time-stamped information will be compared with similar metrics that are derived by the Pathfinder Module to provide insight into grid characteristics, such as power-signal phase at the signaling module location, relative to the power-signal phase at other locations in the grid, such as at the location of the Pathfinder Module. The architecture will also provide for characterization of local environmental conditions (wind speed, temperature and others) and provide the ability to acquire and process data from machinery or other devices on which the Signaling Module may report. In some embodiments, the Signaling Module will be capable of performing signal processing, feature extraction, pattern recognition and other operations, as necessary to characterize important information regarding the status, operation and other factors of relevance to efforts aimed at improving the performance of the system or its elements, or other research-related work. In some embodiments, the Signaling Module may be used to perform local monitor-and-control (M&C) functions via wired or wireless connectivity to relays, switches, electrical enclosures and other equipment, instruments or devices.

In systems where the Pathfinder Module and Grid-surveillance module are not integrated into a single, hardware platform, bi-directional communication is employed to convey important information, between the units.

Some embodiments of the system will include a plurality of Pathfinder Modules and these will be connected via private or commercial networks to a single Grid-surveillance Module to support bi-directional communication between the plurality of Pathfinder Modules and a single Grid-surveillance Module.

Embodiments of the invention may include multiple Grid-surveillance Modules, connected via private or commercial networks to each other, to support bi-directional communication of information such as may be required for operational optimization across the entire grid, or portion thereof. Nothing in this description is intended to exclude bi-directional communication between any element of the system (Signaling Module, Pathfinder Module, Grid-surveillance module) and any other element of the system, individually or as a plurality, using power-line communication and/or communication over private or commercial networks. For example, the use of private or commercial communication-networks would be used to support capabilities such as:

monitor-and-control features, updating operating coder or other functions supporting the objectives of the system.

FIG. 1 illustrates a three-phase electrical grid and power supply system 100 according to an exemplary embodiment of the invention. Notionally, the system 100 can be divided into two sections, one comprising infrastructure 110 located away from an electrical-grid distribution-substation and the second comprising a substation infrastructure 120, including the terminal points of all feeder-conductors on distribution buses and distribution transformers that reduce the incoming transmission-line voltages to lower voltages for distribution over the distribution electrical-grid. In a three-phase power supply system, three conductors each carry an alternating current of the same frequency and voltage amplitude relative to a common reference but with a phase difference of one third the period.

As shown, the transformer configurations are all of the "wye" (or "star") type. However, nothing in the invention limits its application to any combination of distribution transformers and winding-connections, including wye, delta or interconnected star, including single-phase and three-phase varieties and configurations. One of ordinary skill in the art appreciates that the number of remote field transformers and feeder-conductors is exemplary only. For example, only four remote field transformers T1, T2, T3, and T4 are shown in order to simplify the discussion herein. In a practical application, numerous remote field transformers and feeder-conductors may be implemented in the electrical grid system. One of ordinary skill in the art appreciates that the number of remote points that can be monitored depends on the periodicity of transmissions from each device, the duration of each transmission and the communication bandwidth provided by the particular system implementation. For example, because there are 86,400 seconds per day, a system employing Time Division Multiple Access, Binary Phase Shift Key modulation, single carrier-frequency, packet duration (including: preamble, payload, error-correction bits and guard-intervals) of 15 seconds would permit 5760 monitored points to report, in a 24-hour period. Actual packet-rates will be defined by the requirements of individual system-implementations.

Each of the remote field-transformers is connected to power-distribution buses 122A-122C at the substation 120, with A-, B- and C-phase conductors terminated on the associated phase-bus (sometimes alternatively, referred to in other literature as Phase 1, Phase 2, and Phase 3 rather than Phase A, Phase B, and Phase C, respectively). The buses 122A-C are supplied by distribution transformers (T5). Each electrical cable that is attached to the individual buses is fitted with a current transformer (CT). As a result of signal-currents passing through, the cable voltages are generated at the outputs of the CTs. At any given point in time, the polarity of the voltage generated is determined by whether the current is flowing into the bus or out of it. The magnitude of the induced voltage is proportional to the rate-of-change of the current, with respect to time.

By monitoring the individual CTs, the Pathfinder Module determines whether each current is an ingress current or egress current, relative to the bus on which the monitored electrical cable is attached. From this information and GPS geo-location information that is embedded in the arriving signal, the schematic and topology of the grid can be determined. Such determination is accomplished by the Grid-Surveillance Module, using stored maps, information discovered by the system, and available, as-built knowledge of the grid infrastructure. The Grid-Surveillance Module can be implemented as a remote server coupled to the Pathfinder Module via a communications network such as the Internet.

The Pathfinder Module is intended to provide for pre-conditioning and sampling of the current transformer signals and the post-processing of the sampled data-streams with the aim of discovering/inferring associations between individual feeder-phase conductors and the electrical/geographical location(s) on the grid from which currently-active signal-transmissions are originating.

In one embodiment, the Pathfinder Module comprises separate subsystems. A first subsystem is used to pre-condition, sample and communicate the discrete-time characteristics of the current-transformer signals to the second subsystem, and is under the control of the second subsystem. The second subsystem controls the operation of the first subsystem and processes the digitized signals to disambiguate associations between feeder-phase conductors and the electrical/geographical location(s) on the grid from which currently-active signal transmissions are originating. It is important to note that the invention is not limited to one-at-a-time signal arrivals, as signals may be communicated at different carrier frequencies, or might be intentionally allowed to overlap, for reasons of time- or spectral-efficiency.

The Pathfinder Module communicates/interacts with the Grid-surveillance module. The Pathfinder Module provides the Grid-surveillance module with feeder-phase/signal-point associations and other information, such as possible transformer-winding configurations, necessary to enable the Grid-surveillance module to construct schematic and topological maps of the grid, making actionable intelligence to the grid operator.

The Grid-surveillance Module can be used to exercise control over the operation of the Pathfinder Module. Control of the Pathfinder Module may also be exercised by local operation, as well.

In one embodiment, both of these modules are implemented via one or more computers. In alternate embodiments, the Pathfinder module is a purpose-built unit, containing processing and control circuitry that can be based on microprocessor, field-programmable-gate-array or application-specific-integrated-circuits, or any combination thereof.

In one embodiment, the Pathfinder Module is a personal computer and associated signal-digitization equipment, located at a distribution Substation and is connected via a commercial or private network to a Grid-surveillance Module, also comprising a personal computer, which is located at an operations center, remote from the substation. In an alternative embodiment, the Pathfinder Module and/or Grid-surveillance Module may be implemented by one or more processors located in the cloud.

Referring again to FIG. 1, a Signaling Module 112 located at transformer T4 injects a signal into the secondary, B-phase winding. The secondary current acts to induce a voltage in the primary, B-phase winding, causing current-flow to result. Primary windings are shown via bold rectangles. Secondary windings are shown via dashed rectangles. The polarity of the voltage induced in the primary winding gives rise to a current that traverses a variety of paths that are external to the B-phase primary-winding, and returns to the end of the B-phase primary-winding that is opposite of the end from which the current originated. In the figure, the direction of current flow for an exemplar point in time is indicated by the direction that the arrows are pointing. Some current-flow paths are internal to other transformers and devices that are attached to the same feeder. However, some of the current arrives at the phase-B power bus.

This arriving current divides and flows in directions that are dependent on the number of conductors attached to the bus on which it is entering or exiting, and on whether the signal current is an ingress current or an egress current. In the discussion that follows, "ingress" and "egress" are taken to mean inward-flowing and outward-flowing directions relative to the bus or buses and not as a directional-reference relative to any transformer.

In FIG. 1, instantaneous current flowing in the B-phase primary-winding of a remote transformer is shown, with the positive and negative voltage-polarity, as indicated, and the arrow indicating the direction of current flow within the winding, at the particular instant in time being used in this example. Throughout the diagram, arrows are used to indicate the direction of current, following various return-paths to the negative end of the B-phase winding, in T4. For the B-phase power bus, it can be seen that the current arriving from the positive end of the B-phase winding of T4 is pointing into the B-phase power bus, indicating that it is an ingress current. This current divides and flows out of the B-phase power bus, following the various return paths that lead back to the negative end of the B-phase winding of T4. Currents leaving any given bus are egress currents. Currents entering any given bus are ingress currents. It can be seen that, for any given bus, the direction of current flow on one conductor is opposite of the directions for all other conductors. Further, it can be observed that the set of three conductors that are opposite comprise the A-, B- and C-phase conductors of the feeder that is supplying T4, the transformer from which the signal originated. This illustrates how the invention is able to disambiguate feeders. Considering only the current directions in the conductors of the feeder identified as supplying T4, it can be seen that the current on one conductor is flowing in a direction that is opposite of the other two conductors. This opposite-flowing conductor is connected to the B-phase power bus. This illustrates the method by which the invention can determine the phase-winding of T4 from which the signal is flowing in accordance with the exemplar, winding-voltage polarity, at the instant of time across which all currents are being measured and analyzed. The variability between grid architectures, such as the number of feeders connected to a set of power buses and transformer winding-configurations, determines the particular signals that will be monitored and analytical techniques to be used in disambiguation of feeder-phases. For example, in the case where three, or more, non-networked feeders are present, analytic techniques do not require the use of signals obtained by monitoring the conductors that connect the buses to transformer that supplies power to the buses. Similarly, the analytic techniques that may be beneficially applied to operate on the ingress and egress relationships to provide for the development of schematic and topological relationships are numerous. No limitation on the actual measurement or analysis methods are intended by the examples provided, here. The actual techniques used are selected and combined as dictated by the number of feeders present, whether feeders are networked and other technical considerations.

At any instance in time, the ingress and egress currents at each of the three power buses may be expressed as a two-dimensional matrix, referred to as the flow matrix. In one embodiment, the entries in row i of the flow matrix capture the current flow between feeder i and the A (column 1), B (column 2), and C (column 3) power buses. A feeder refers to a group of electrical conductors supplying one or more transformers. An ingress current will be represented with a 1 in the flow matrix and an egress current will be represented with a 0 in the flow matrix. With these conventions, the flow matrix for FIG. 1 may be shown to be equal to $$\begin{bmatrix} 1 & 0 & 1 \\ 1 & 0 & 1 \\ 0 & 1 & 0 \end{bmatrix}$$

However, it is important to keep in mind that the signal polarities will toggle, resulting in the following flow matrix $$\begin{bmatrix} 0 & 1 & 0 \\ 0 & 1 & 0 \\ 1 & 0 & 1 \end{bmatrix}$$

In addition to encapsulating the aggregate, dominant, current flow, the flow matrix may also be used in some cases to identify the feeder and phase on which the signaling module transmitted. For FIG. 1, the correct feeder is identified as the row with the unique pattern of 0's and 1's. Once the feeder has been identified, the phase as identified as corresponding to the column with the unique entry. Using this algorithm, the signaling module in FIG. 1 transmitted on Feeder 3 Phase B. It is straight forward to abstract this algorithm to a grid topology having three (3) or more non-networked remote-field wye transformers. When the grid topology starts to deviate from this simplistic setting, more information must be used in order to successfully disambiguate.

FIG. 1 may be used to introduce the complications that arise in the networked feeder case. The ingress and egress patterns for networked feeders are equivalent and therefore the patterns of 0's and 1's in the flow matrix for the associated rows will match. As the flow matrices above show, this introduces ambiguity in the determination of feeder phase as identical rows are expected in the flow matrix. In order to eliminate the ambiguity, additional information as provided by a distribution-side transformer is required. The key requirement for the distribution-side transformer is that it not transmit any signal out to the field. To this end, one algorithm for disambiguation is to first identify the phase by inspecting the ingress/egress current patterns between each of the three power buses and the distribution-side transformer. When this transformer is wired in a wye configuration, the correct phase will have a different flow direction than the other two phases. In FIG. 1, the ingress/egress pattern between the power buses and distribution transformer is

[1 0 1]

and therefore, B is the correct phase. With the phase properly identified, the feeder may be identified by inspecting the column of the flow matrix corresponding to the proper phase and choosing the feeder(s) with current flow opposite that of the flow between the distribution transformer and power bus. For FIG. 1, the column for phase B is as follows $$\begin{bmatrix} 0 \\ 0 \\ 1 \end{bmatrix}$$

As the instantaneous current flow between the B bus and distribution transformer is an egress current (represented by 0), the proper feeder should pass an ingress (represented by 1) current to the B bus. Therefore, the proper feeder is Feeder 3.

Figure 2:
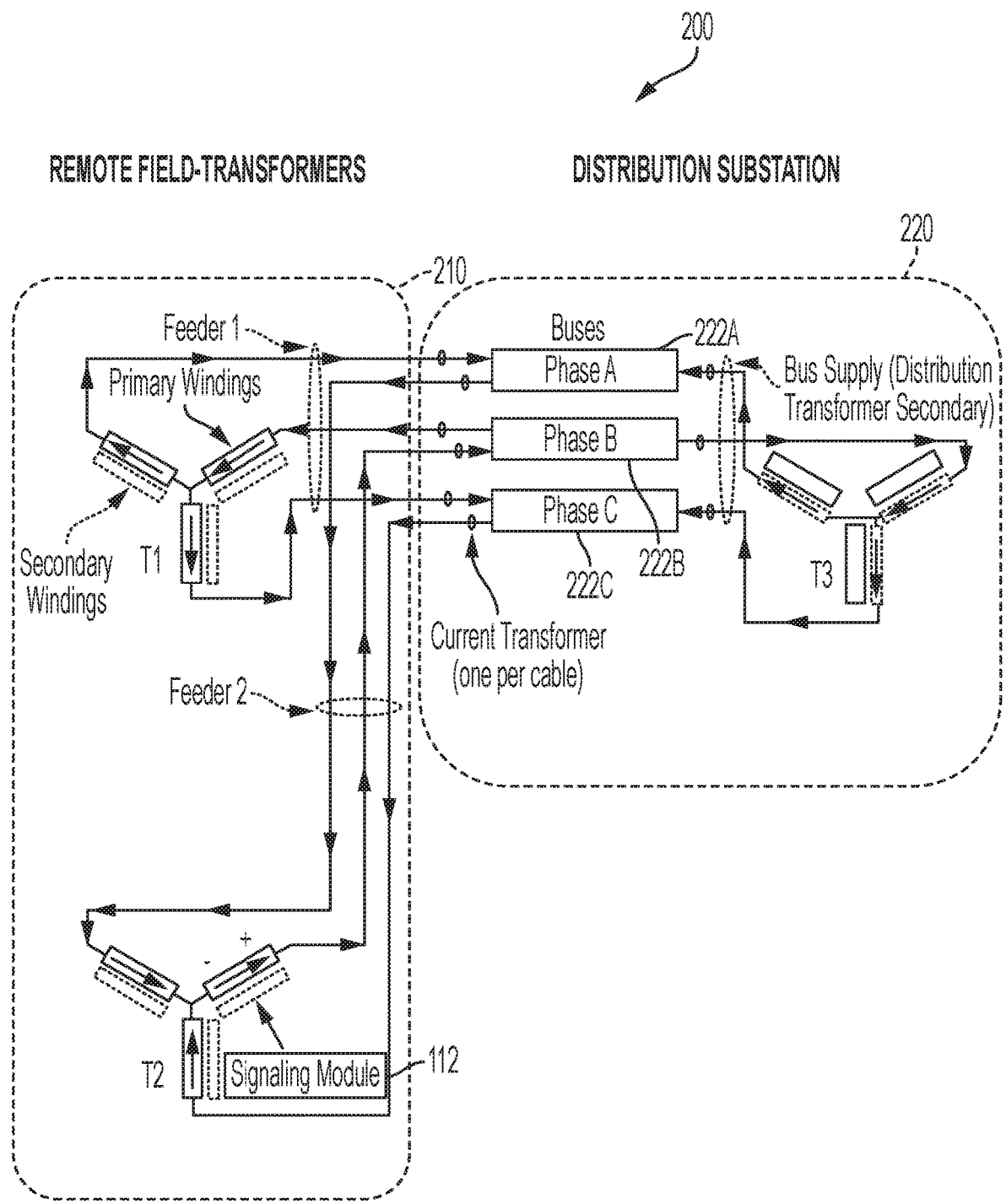
FIG. 2 illustrates an electrical grid system according to another exemplary embodiment of the invention.

FIG. 2 illustrates an electrical grid system 200 according to another exemplary embodiment of the invention. The electrical grid system 200 comprises remote field-transformer infrastructure 210 and distribution infrastructure 220. The remote field-transformer infrastructure 210 comprises transformers T1 and T2. The distribution infrastructure 220 comprises buses 222A-C supplied by distribution transformers (T3). Here, a minimalist, exemplary architecture is shown to aid in illustration of the flow of instantaneous currents in the power-distribution cables, buses and transformers. For the sake of illustration, the illustration is meant to show a "snapshot" of the current flow, under the condition of voltage polarity that is shown on the primary, B-phase winding of transformer T2.

Considering the case of an ingress current from T2 that flows into the B-phase bus, the ingress signal current divides and takes the form of egress-current in other conductors attached to the same bus. In the case shown, there are two, egress currents. However, the conceptual addition of more conductors to the same bus will result in additional egress currents, as there can be only one ingress current in the case shown and it is the result of the instantaneous polarity-case shown for the signal-current.

Examination of other buses shown that two of them, A-phase and C-phase, are characterized by identical ingress (quantity: 2) and egress (quantity: 1) currents and these are different patterns from the B-phase bus, which is characterized by a single ingress current and two egress currents. The unique ingress/egress pattern observed for the B-phase bus indicates that the signal arrived via the B-phase conductor of Feeder 2, as this current flows in a direction that is unique, when compared to the currents of the other conductors on the B-phase bus, and the B-phase ingress/egress pattern is unique from the other two buses, which have identical patterns. This illustrates the foundational concept of the invention, that the proper signal-module/feeder-phase association can be robustly and unambiguously established by inter-conductor analysis of ingress/egress current-patterns, executed at common point of connection in the grid. In the current case, this is assumed to be at a substation, but the invention is valid for, and extends to, disambiguation of load/conductor relationships in other grids, where such architectures exist. One example would be operation on the secondary side of intermediate transformers between the substation and distant signaling-points on the grid fed by such intermediate transformers.

When embodied in a system, the technique of the invention requires that transmissions from individual points (i.e., multiple Signaling Modules) being monitored do not interfere with one another. This can be accomplished by using one of a set of channel-access methods that are commonly employed in digital communications, to avoid interference between packet-transmissions and facilitate reception. For example, in Time Division Multiple Access systems, packets are not permitted to temporally overlap. This is equivalent to saying that each transmitter is provided with an assigned time-interval, or "time slot", in which it, and no other transmitter, is permitted to transmit. Using this technique, multiple transmitters or modems can be deployed on a common grid, each at a desired location in the infrastructure, and can successfully transmit (and/or receive) on an established schedule. Similarly, Frequency Division Multiple Access systems employ separation in carrier frequencies to permit transmissions that may temporally overlap, but are spectrally separated. Code Division Multiple Access is yet another channel-access method that permits temporal and spectral overlap, and recovers individual packet-transmissions by means of cross-correlation with unique codes employed during origination of the transmitted packet to be received. By any of these means, which are exemplary only, or combinations thereof, multiple Signaling modules can be successfully operated on the same grid infrastructure. Note that in some embodiments, Signaling Modules may receive and analyze signals from other Signaling modules and communicate derived and other information, such as regarding power-signal phase-connectivity, to other elements of the system, such as the Pathfinder Module, to augment information available for analysis of grid operations.

Figure 3A:
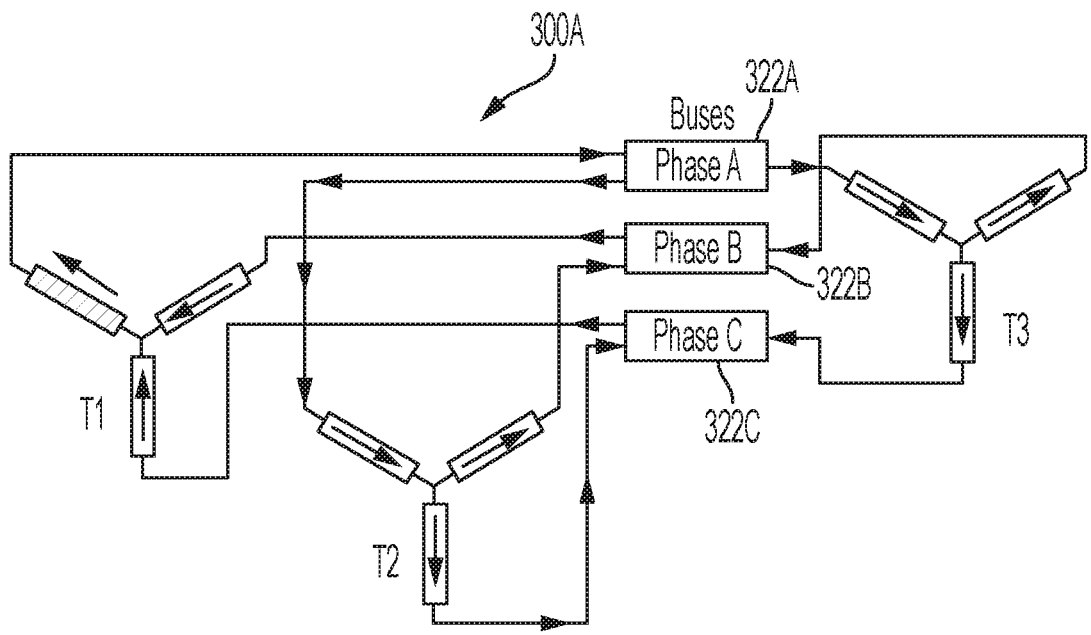
FIGS. 3A-C illustrate three, simplified examples, using "wye" and delta configurations to unambiguously identify signaling-module and feeder-phase association.
Figure 3B:
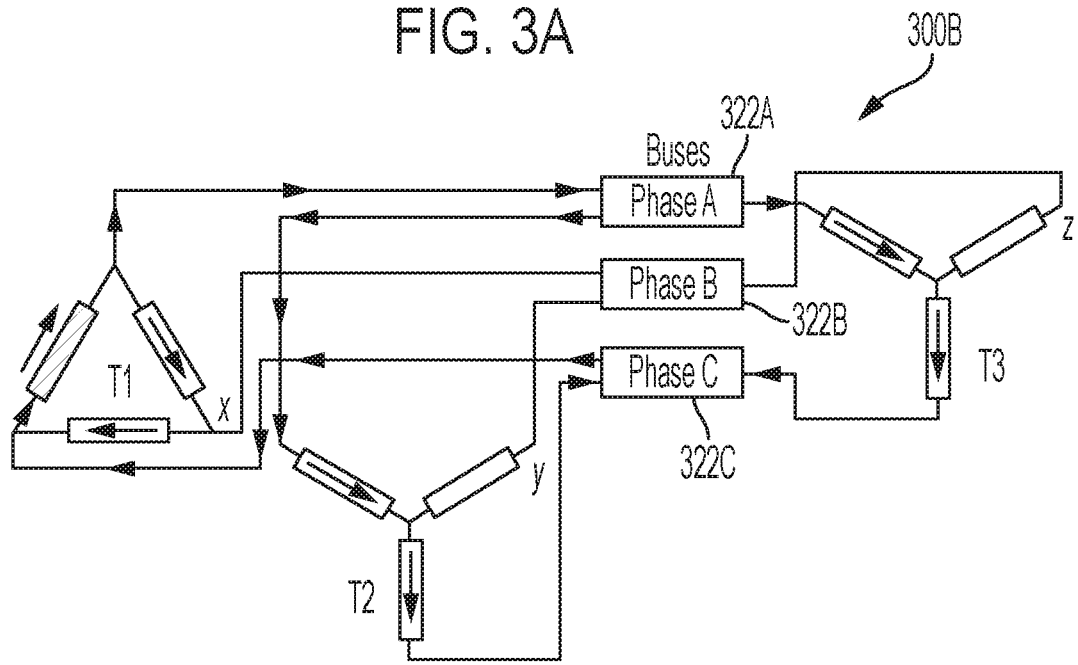
Figure 3C:
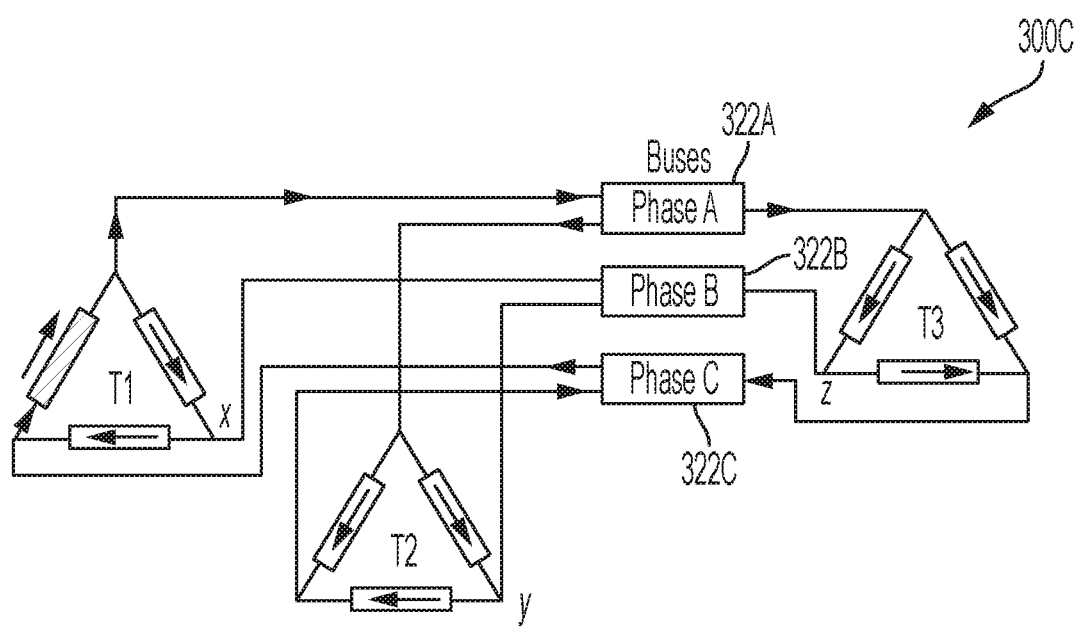

FIG. 3 provides three, simplified examples, using "wye" and delta configurations 300A-C to illustrate unambiguous identification of signaling-module and feeder-phase association. In the three configurations illustrated as FIGS. 3A-C, the primary windings of T1 and T2, and the secondary windings of T3, the distribution transformer that is supplying the buses, are shown. This is not relevant to the results and is only stated for the sake of clarity. In all three configurations, the shaded winding represents the winding onto which a voltage has been induced by action of a signal source.

For ease of comparison, FIG. 3A illustrates a simplified model of the all-"wye" configuration, previously shown in FIG. 2. FIG. 3B replaces one wye-configured transformer with a delta configured unit. FIG. 3C shows the characteristics for a grid using only delta-configured transformers. For purposes of discussion, the transmitted signal used in all configurations shown can be assumed to be a sinusoid, although the invention is not restricted by the waveform of the signal. In the diagrams, arrows are used to indicate ingress current (arrow pointing into the bus) or egress current (arrow pointing outward from the bus). The currents are discovered by observing the instantaneous voltage present at the output of the current transformer that is associated with the particular conductor in which the current is flowing. Current measurements that are made for the purpose of illustrating disambiguation are instantaneous values, taken at the same point in time, across all conductors attached to the buses. Although the present invention is discussed in the context of instantaneous values, which is convenient in explaining how the invention works, embodiments of the invention may use a cross-correlation approach (described above) and analyses of the polarity of the received signals at multiple time-aligned intervals, to discover the direction associated with the current being analyzed and to increase the reliability of the ingress vs. egress classifications, to provide better performance under conditions of poor SNR, which is generally the case on the grid.

Referring to FIG. 3A, the classification of the instantaneous currents as either ingress or egress, are illustrated for the case wherein the instantaneous, signal current, on the A-phase bus 322A, is an ingress current and the other currents on the same bus are egress currents. Because the sum of ingress and egress currents must be equal to zero, the magnitude of the sum of the egress currents are equal to the magnitude of the ingress current. The egress current that returns to the signaling-winding does so via more than one path. This means that the maximum magnitude of the ingress current, as measured at the A-phase bus 322A, will be greater than the maximum magnitude of any other signal on any other bus 322B or 322C, for the case illustrated. But knowledge of which instantaneous current is the largest is not necessary to the invention. The innovation is in using the relationships between the currents on individual buses and between buses to reveal the signal-source/feeder-phase association and, thereby, enable disambiguation of the grid conductors and the areas served. Also, there can be cases in which the instantaneous magnitude of the signal on a single conductor may be equal to, or less than (due to noise and other effects) that of another conductor on a different bus. This is suggested by FIG. 3B and FIG. 3C.

FIG. 3B and FIG. 3C show the bus ingress/egress currents, when the signal originate from a delta-configured transformer T1 and the other transformers are delta-configured or wye-configured, as shown. It is noteworthy that, in this type of grid topology, the instantaneous voltages at nodes such as x, y and z, that are connected to a common bus, such as the B-phase bus in FIG. 3c, can be virtually identical. Therefore, relatively little or no current flows in the B-phase bus 322B, when compared with the currents flowing in connections to the other two buses. Noting the absence of such current flow is a defining metric in identifying the correct feeder-phase.

Importantly, knowledge of the structure of the transmitted signal can also aid in developing insight into the schematic-connectivity and topology of the grid. For example, conventions followed in the construction of a signal, such as the use of a known pattern of symbols in the preamble of a digital transmission, can make available information that, in some scenarios, may be considered in conjunction with whether the signal-current is an ingress current or egress current to provide additional insight about the presence or absence of particular transformer-configurations in the signaling path.

The present invention can be used to discover the connectivity between two points in a variety of electrical circuits in which it is feasible to introduce a tracing-signal but where methods such as turning circuits on-and-off or otherwise interrupting power to determine the connection between a power conductor and a particular load may not be feasible or permitted. Such scenarios occur in large industrial operations, and other places, where electrical systems have been subject to poorly-controlled modifications, over time.

An experimental apparatus has been constructed to reproduce exemplar, grid topologies in the lab. The apparatus permits reconfiguration of transformer winding-connections, as needed to implement the topology being investigated. The apparatus has been used to test a variety of modeled, grid architectures, including those shown in FIG. 3. The successful results of the testing confirmed analytically-predicted ingress/egress relationships of the instantaneous currents and robust, unambiguous discovery of the transformer coil excited by the signal-source, as identified by the method. Laboratory measurements have confirmed that, regardless of other paths by which the signaling current may flow to the originating-coil of the sending-transformer, the signal-current that arrives at the point of common connection of conductors divides and flow along paths that can be comparatively analyzed to consistently and accurately reveal the connections between the originating point of on-grid signal-sources and the feeder-phase(s) that supply such points.

One of ordinary skill in the art appreciates that the grid configurations shown in FIGS. 1-3 are exemplary only and the present inventive concepts can be employed on any possible grid configuration.

Fluctuations in the line voltage can cause a phenomenon called flicker. One manifestation can be observed in a change in the illumination provided by a light source. Flicker commonly results from variations in electrical loading, such as can occur during the operation of welders, induction furnaces. However, variations and associated flicker can be caused by power-line communications, as well. Depending on degree and frequency of occurrence, variations in line-voltage may produce flicker that is imperceptible, observable or the cause of irritation (reference: Institute of Electrical and Electronic Engineers (IEEE) Standard 141).

Digital transmissions produce variations in the line voltage. As the strength of the transmission is increased, so is the degree of variation. The risk of observable, or irritating, flicker is increased when the variations in the transmitted signal occur within the frequency range illustrated in IEEE 141, FIG. 3-8.

System transmissions that produce low-frequency (e.g. in the 300 Hz to 3000 Hz, Ultra Low Frequency band) variations in the power-signal may be observable or irritating, particularly if the power of the transmission causes an adequately high variation in the voltage of the power signal.

An embodiment of the invention operates to increase the symbol rate of the transmission. This increases the frequency at which variations in the line voltage occur. If this rate is sufficiently high when considered in conjunction with the power of the signal, flicker may be made less observable. This would enable a stronger transmission, which is desirable for increasing the range at which transmitted messages can be received and accurately recovered.

One method used by the invention to increase the symbol rate without increasing the data rate and lowering the ratio of the ratio of bit-energy to noise energy (Eb/No) begins with limiting the number of sequential one or zero bits in the message string through the use of scrambling. Next, the individual information bits are each operated upon using spreading sequences, to result in a DSSS transmission signal. The combination of these two methods increases the effective symbol rate transmitted through the channel and, correspondingly, the occupied bandwidth. The increased symbol rate will produce signal variations with periods that are shorter than those where sensitivity to flicker is higher, mitigating the flicker effect, for any given level of transmission power.

Because the resulting, occupied bandwidth may be greater than the separation between adjacent harmonics of the 60 Hz power-signal, it is necessary to take steps to prevent the transmission of energy at these harmonic frequencies, as prohibited in some grids. In one embodiment of the system, this is accomplished by notch-filtering the signal to be transmitted, to remove energy at the harmonic frequencies that would otherwise experience transmission energy. In a second embodiment, the spectrum of the transmitted signal is first partitioned into a set of sub-bands, each of which will fit between the 60 Hz separation between the harmonics of the power signal and, then, each sub-band is individually translated in frequency in a manner that centers each sub-band on a unique frequency, midway between harmonics, using methods such as described in Fragmentation Channelizer, U.S. Pat. No. 8,761,280, the entire disclosure of which is incorporated by reference herein.

In some embodiments, the system may use a reference clock that is derived from the 60 Hz power signal as a means of ensuring that signals remain accurately positioned in the frequency domain, relative to harmonics. Most systems use a clock-reference chip that resides on the circuit board. One wouldn't necessarily expect these to be synchronized in any way to the 60 Hz. But, because the 60 Hz signal actually drifts around during the course of the day, the location of the harmonics drift around in frequency, as well. If this drift is not accounted for, it is possible that trying to center the bandwidth of a transmission at some precise location, relative to the 60 Hz harmonics, results in harmonics drift over into the transmission bandwidth, at some other time. By deriving timing from the 60 Hz power-signal, this problem can be avoided.

In another embodiment of the invention, the present invention uses the Pathfinder Module (or the Signaling Modules) to conduct local analyses of the power signal that is native to the grid, for the purpose of extracting supplementary information that could enhance the ability to form schematics and topological maps, provide alerts and so forth. The Pathfinder Module can do more than simply process the Signal Module signals and communicate with them. In particular, the Pathfinder Module is used to inject test signals onto the line to gain a more accurate, on-demand measurement of the current-division at the bus. This might help to inform an operator of conditions on the grid that suggest a more optimal transmission frequency, for example, or otherwise helps to detect changes in load that might signal damage to the system.

The computing resources of Signal Modules and Pathfinder Modules will operate on the native electrical-signals on the grid to inform the Pathfinder Module and Grid-surveillance module of the occurrence of events and presence of conditions on the grid that are relevant to enabling schematic-mapping, topological-mapping, alerting, optimization of grid operation, optimization of the operation of the invention-system and other objectives. Such analyses are made possible because events and conditions of interest exhibit particular electrical signatures that can be detected, recognized and classified. An example can be found in the detection of a remote feeder-switching event and identification of the particular switch, via examination of the electrical signature of the event. Another example is the accurate characterization of current-division at buses, as this information can be used to gain insight, such as the transfer function, into the electrical characteristics of the specific installation.

The extraction of supplementary information from signals occurs at a bus, such as the distribution bus at a substation, and is executed by the Pathfinder Module, operating on current-transformer signals that occur when a packet arrives from a Signaling Module. However, the accuracy of such analyses could be improved by the use of signals of programmable waveform and power characteristics that are locally-injected on feeder-phases at the substation and are not necessarily affected by impairments imposed by the channel between the Signaling Module and the Pathfinder Module.

In one embodiment of the invention, the Pathfinder Module will induce a signal into a selected feeder-phase conductor, via the associated current transformer. This signal will then be measured at current transformers that are associated with the other conductors of the same bus and on other buses. The set of resulting signals, along with the induced signal, are used to provide an accurate estimate of the current-division characteristics of the bus. This measurement may be repeated using each conductor on each bus, in turn, to arrive at an aggregated solution regarding the transfer function characteristics of the various channels at the bus.

The computational assessment of grid-related events, characteristics and conditions is not intended to be confined to the Pathfinder Module and can be executed by any element in the system, as appropriate to the particular need.

Those of ordinary skill in the art will appreciate that the various illustrative logical blocks, modules, units, and algorithm steps described in connection with the embodiments disclosed herein can often be implemented as electronic hardware, computer software, or combinations of both. To clearly illustrate this interchangeability of hardware and software, various illustrative components, blocks, modules, and steps have been described above generally in terms of their functionality. Whether such functionality is implemented as hardware or software depends upon the particular constraints imposed on the overall system. Skilled persons can implement the described functionality in varying ways for each particular system, but such implementation decisions should not be interpreted as causing a departure from the scope of the invention. In addition, the grouping of functions within a unit, module, block, or step is for ease of description. Specific functions or steps can be moved from one unit, module, or block without departing from the invention.

The various illustrative logical blocks, units, steps and modules described in connection with the embodiments disclosed herein, can be implemented or performed with a processor, such as a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein, and those provided in the accompanying documents. A general-purpose processor can be a microprocessor, but in the alternative, the processor can be any processor, controller, microcontroller, or state machine. A processor can also be implemented as a combination of computing devices, for example, a combination of a DSP and a microprocessor, a plurality of microprocessors, one or more microprocessors in conjunction with a DSP core, or any other such configuration.

The steps of a method or algorithm and the processes of a block or module described in connection with the embodiments disclosed herein, and those provided in the accompanying documents, can be embodied directly in hardware, in a software module executed by a processor, or in a combination of the two. A software module can reside in RAM memory, flash memory, ROM memory, EPROM memory, EEPROM memory, registers, hard disk, a removable disk, a CD-ROM, or any other form of storage medium. An exemplary storage medium can be coupled to the processor such that the processor can read information from, and write information to, the storage medium. In the alternative, the storage medium can be integral to the processor. The processor and the storage medium can reside in an ASIC.

In an another exemplary embodiment of the present disclosure, a portion of a transmitted signal comprises a preamble comprising one, or more, sequences of modulated information-bits. As is exemplar of modulated bit-streams in digital communications, these modulated bits result in a sequence of symbols. By construction of the sequence of information bits using complementary series, the resulting waveform received by a Pathfinder Module or other Signaling Modules, may be used as an estimate of the impulse response of the circuit path between the transmitting module and receiving module, within the limits of the transmission bandwidth. By sequentially transmitting from each individual Signaling Module present on the grid and simultaneously receiving at all other Signaling Modules and the Pathfinder Module, and transmitting the resulting impulse response(s) and module identification(s), to the Pathfinder Module, feeder-specific databases of impulse responses for the circuit paths between all modules on each feeder will be captured and stored. Because the electrical characteristics of a circuit path determine the associated impulse response, changes to the electrical characteristics will produce a change in the impulse response. Factors such as grid-phases shorted to ground, grid-phases shorted together, degraded insulators, and other types of faults, are exemplary conditions that will produce a change in the electrical characteristics of affected paths and associated impulse responses. The resulting changes in impulse responses will be comparatively analyzed against the database of impulse responses captured during normal operation to reveal the presence of faults. The nature of the effect on individual, or aggregated, impulse responses will aid in assessing the electrical proximity of the fault to the receiving module. By assessing the gathered grid information combined with knowledge of the schematic connection of each module communicating impulse response data, faults or system degradations will be detected and localized.

Figure 4:
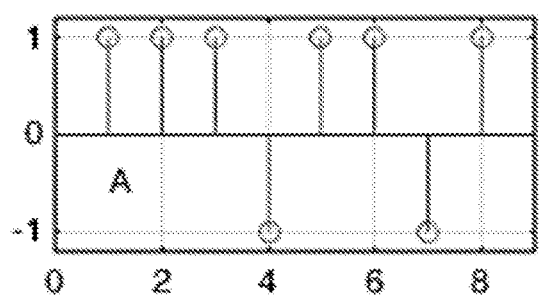
FIG. 4 illustrates exemplary complementary series and illustration of impulse response, according to an exemplary embodiment of the present disclosure.
Figure 4:
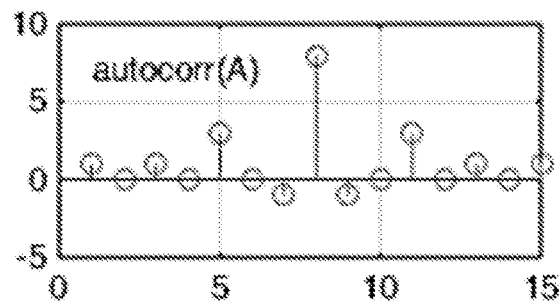
Figure 4:
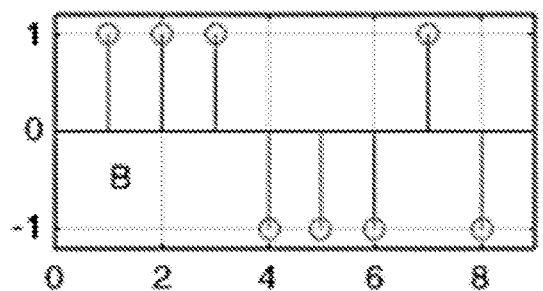
Figure 4:
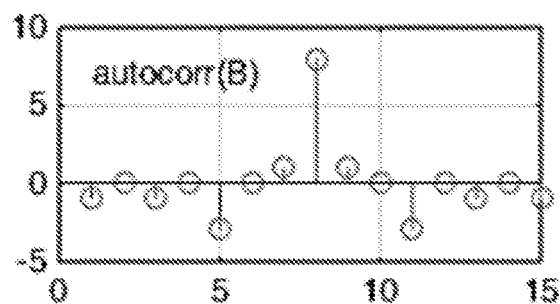
Figure 4:
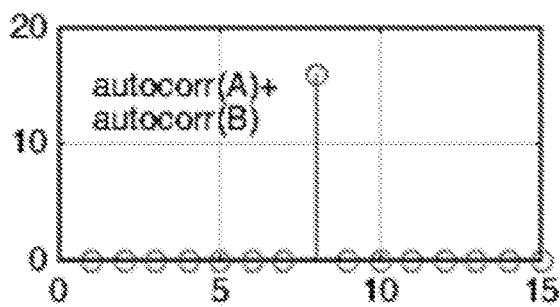

In an exemplary embodiment and with reference to FIG. 4, complementary series are pairs of orthogonal, binary phase sequences. The sidelobes of the autocorrelation of either member of the pair are known to be equal in amplitude and opposite in polarity, compared to the autocorrelation sequence of the other member of the pair. For example, complementary codes A and B, of length 2N may be generated from:

$$A(n+1)=[A(n)B(n)]$$

$$B(n+1)=[A(n)\overline{B}(n)]$$

where $A(0)=B(0)=1$
$\overline{B}(n)$ is the complement of $B(n)$.
For N=8 the generated codes are A=[1 1 1 0 1 1 0 1] and B=[1 1 1 0 0 0 1 0]. Converting zero to minus one yields: A=[1 1 1 -1 1 1 -1 1] and B=[1 1 1 -1 -1 -1 1 -1].

In another exemplary embodiment and with reference to FIG. 4, the autocorrelations of A and B, along with the sum of the autocorrelations. The sidelobes of the autocorrelations of A and B are of equal and opposite polarity, canceling when summed and resulting in a single peak, the perfect channel probe for obtaining the desired impulse responses of the grid transmission-channels. In accordance with the embodiments herein, Quadrature Phase Shift Keying ("QPSK") modulation will be used to transmit one of a pair of complementary codes as the in-phase component, while the other code will be transmitted as the quadrature component. At the receiver, the in-phase and quadrature streams will be passed through filters, the coefficients of which would be, in the example above, A and B. Summing time-aligned elements of the streams will produce the estimate of the impulse response of the channel.

Figure 5:
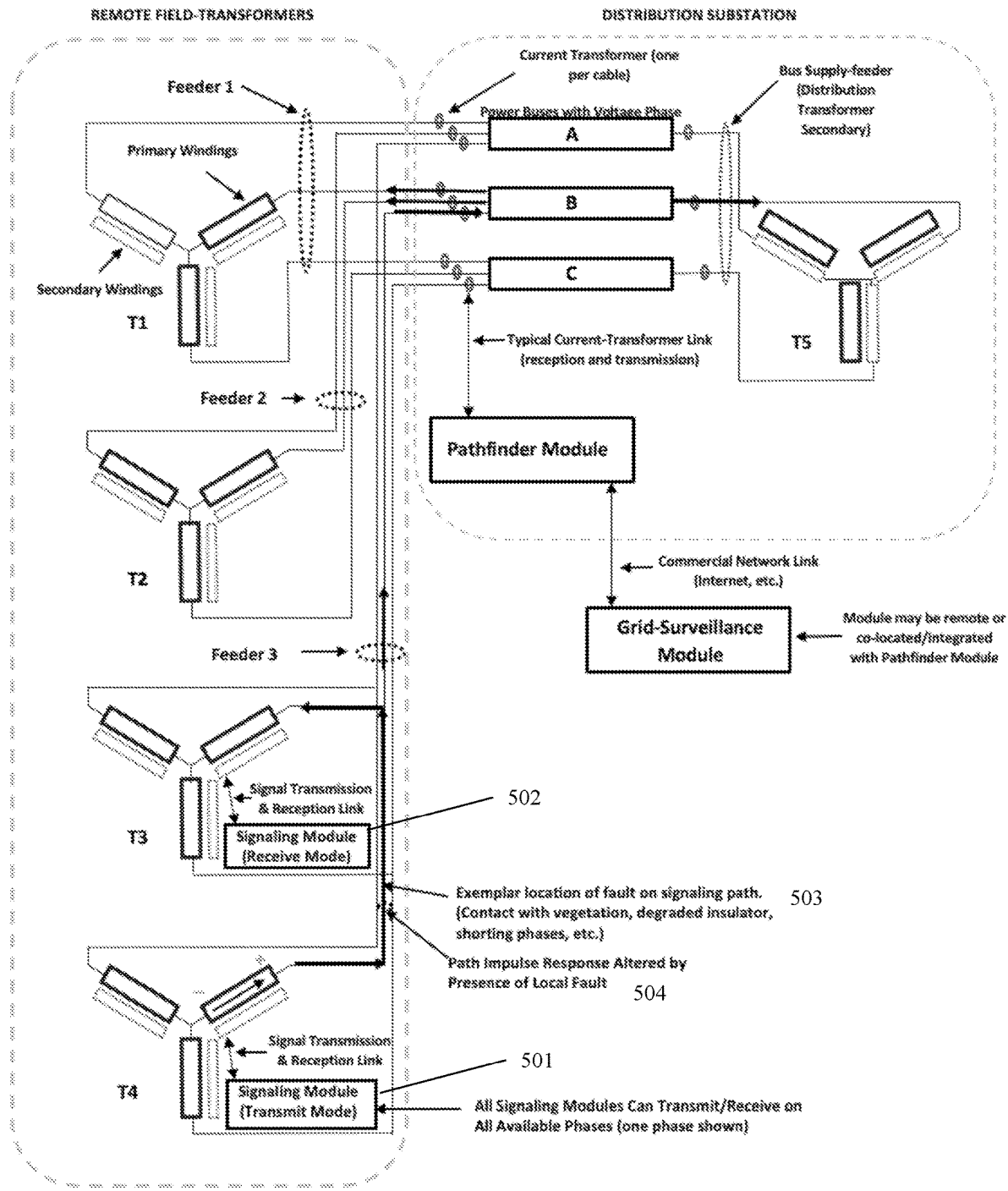
FIG. 5 illustrates an exemplary detection and localization of grid fault by analysis of impulse response by signaling modules operating in receive mode, according to an exemplary embodiment of the present disclosure.

In another exemplary embodiment and with reference to FIG. 5, the system for identifying faults is deployed on an exemplary electrical grid comprising a distribution substation and a plurality of field transformers T1, T2, T3, and T4. Although a single substation and four remote field transformers are shown, the system may be deployed on an electrical grid comprising any number of remote field transformers and/or distribution substations with departing from the contemplated embodiments. Signaling module 501 is configured to send a signal over the electrical grid. Signaling module 502 is configured to receive the signal sent from signaling module 501. In some embodiments, the signal comprises a plurality of signals transmitted at a plurality of bands. The sending module 501 sends the signal to the receiving module 502 utilizing the signal path 504. In this exemplary embodiment, a fault 503 exists along the signal path 504. Once the signal is received at the receiving module 502, the signal path's 504 impulse response may be determined. Once the impulse response of the signal path 504 is determined, it may then be compared against historical data. The comparison may reveal the deviation caused by the fault 503. Once the deviation exceeds a certain threshold, the system indicates that the fault 503 exists.

Figure 6:
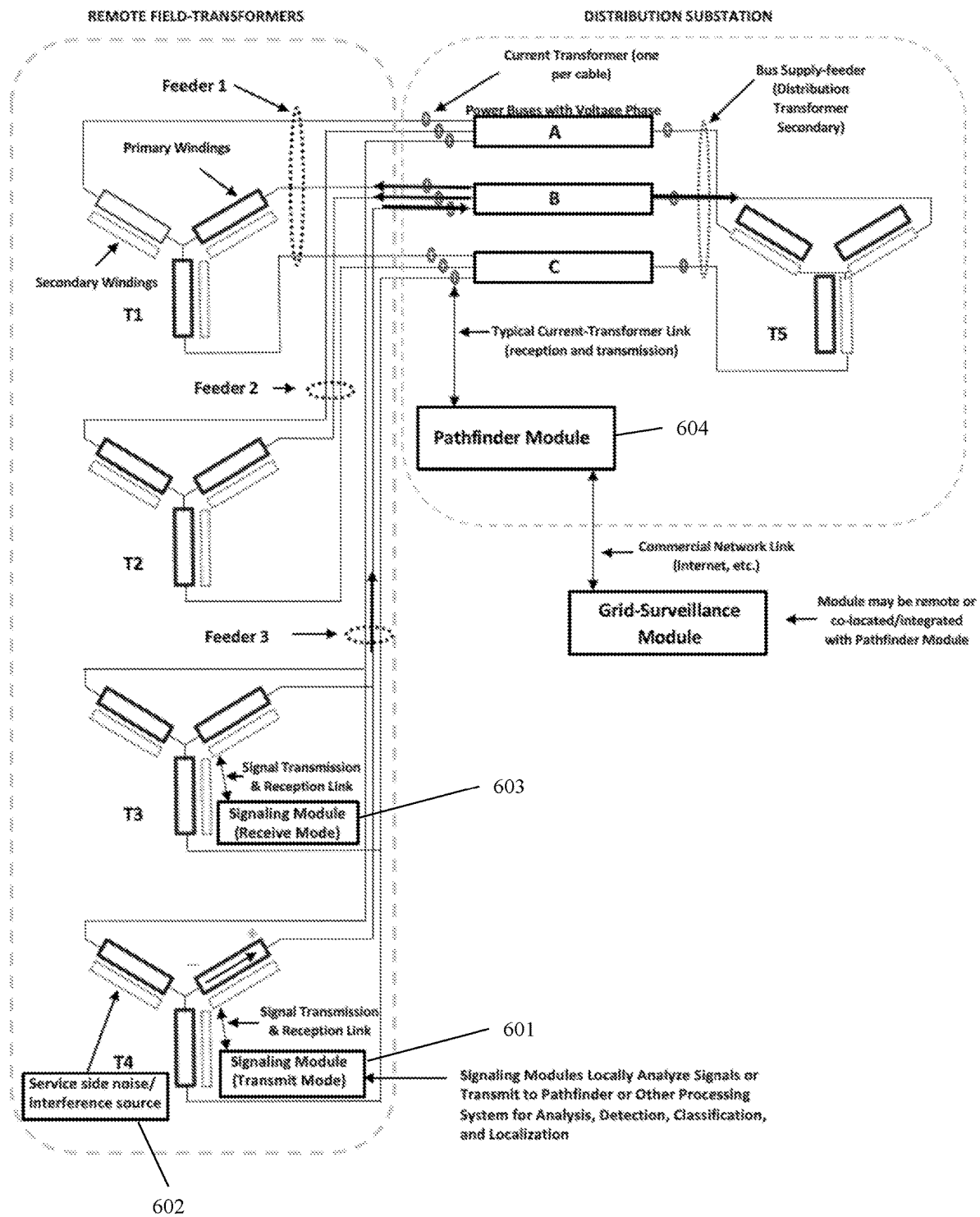
FIG. 6 illustrates an exemplary detection, classification, and localization of noise and/or interference sources, according to an exemplary embodiment of the present disclosure.

In another exemplary embodiment of the present disclosure and with reference to FIG. 6, signaling modules 601, 603 are operated to monitor broad, spectral bandwidths, to capture variations in voltage-signals and current-signals caused by interference source 602. Interference sources 602 are energy resources and other devices such as appliances that are connected to, or radiating onto or nearby, the grid. These signals can be processed by a plurality of signaling modules 601, 603, or transmitted to a Pathfinder Module 604, or other, processing system, and analyzed to identify the likely origins, such as fault type, equipment operation, intentional radiator, or other mechanisms, by which they were generated. In such an embodiment, sources of noise or spurious emissions that may degrade the signal quality provided by the grid are detected and localized.

Figure 7:
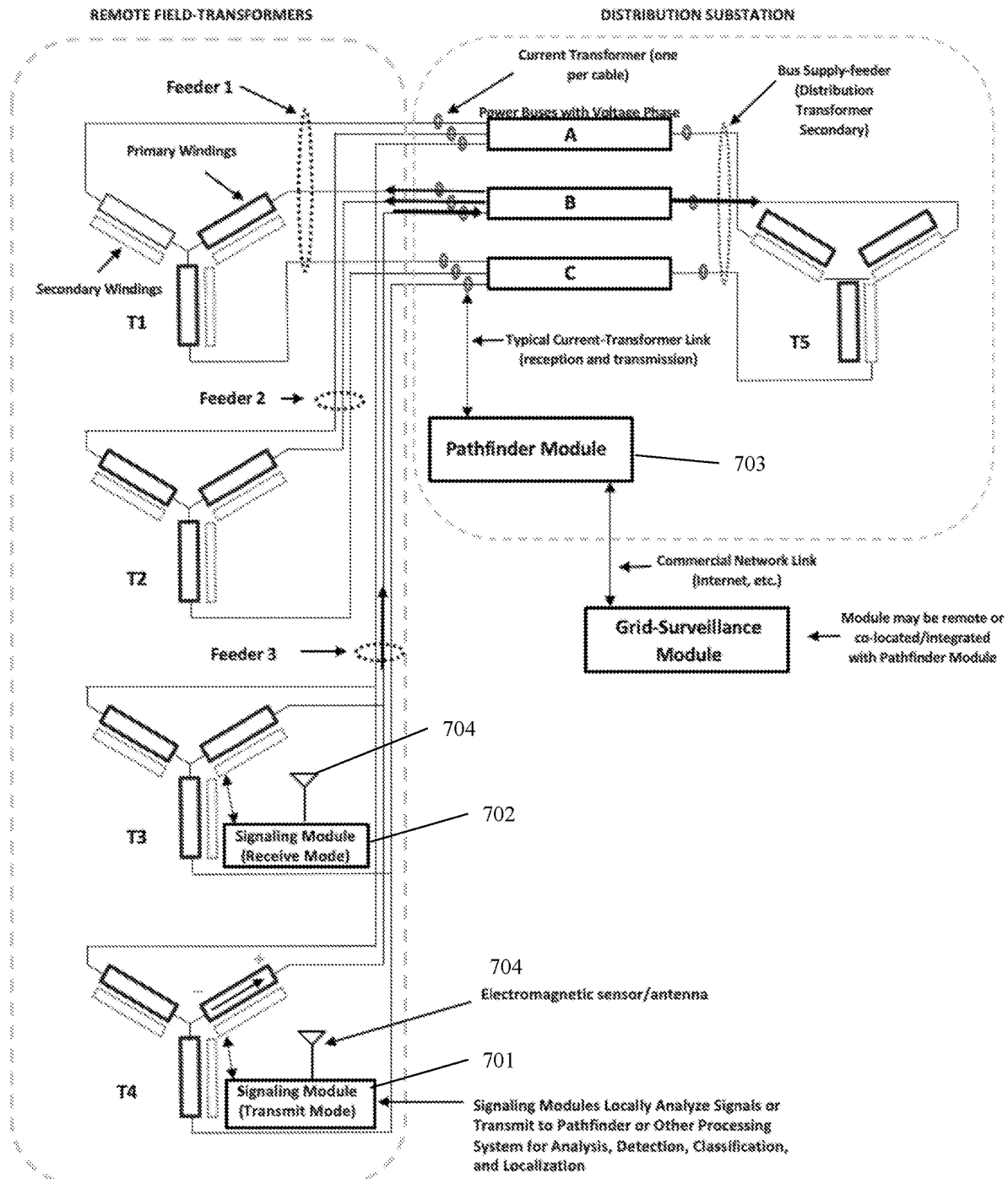
FIG. 7 illustrates an exemplary detection, classification, and localization of anomalous conditions by analysis of radiated emissions, and detection of intentional transmission by analysis of radiated emissions, according to an exemplary embodiment of the present disclosure.

In another exemplary embodiment of the present disclosure and with reference to FIG. 7, signaling modules 701, 702 and pathfinder module 703 incorporate radio-sensing technology. The radio technology includes antenna structures 704. The radio technology may be used to monitor and process electromagnetic energy that impinges on the associated antenna structures. The detection of energy radiated from electrical conductors is utilized in the detection, localization, and characterization of faults, and in the reception of intentional transmissions by elements of the system, e.g., signaling modules, pathfinder modules, and other devices equipped with signal generation/reception technology, particularly where the fidelity of the spectral content may otherwise be altered by passage through a distribution transformer.

In another embodiment, signaling modules 701, 702 are used to take measurements of various parameters of grid elements, for example, transformers, capacitors, structures, and other grid elements. The measurements may be used to evaluate structural and electrical condition and performance of the elements. Such measurements can include, but are not limited to, active interrogation using ultrasound, acoustic signals, or lasers and passive observations of electrical or mechanical behavior, such as by strain gages, temperature gages, optical systems such as cameras, infrared sensors, or other sensors capable of responding to physical or chemical stimuli. Such observations may be used to monitor the condition of grid infrastructure and/or its components, and to make diagnostic and prognostic assessments of condition and remaining service-life. In an illustrative example, the signaling modules 701, 702 may be utilized to perform structural- and/or electrical-monitoring of distribution transformers, to provide alerts that will permit planned maintenance, avoiding unexpected failure and associated, unplanned outage.

In another exemplary embodiment, signaling modules are used to identify the schematic and topological connection of other devices and the grid. Examples include, but are not limited to, other measurement devices, such as phasor measurement units, meters, transformers, sectionalizer switches, and reclosers.

In another exemplary embodiment, portable signaling modules are used to facilitate connection at arbitrary locations on the grid, for mapping the schematic and topology of specific locations on the grid, aiding in the localization of electrical phenomena, and other analysis, characterization and monitoring purposes.

In another exemplary embodiment, signaling modules are used in conjunction with suitable sensors to provide for monitoring and reporting of environmental factors and the detection of threats, such as gunfire or other indicators of malicious intent, unauthorized presence, smoke, fire, electrical tampering, mechanical tampering, flooding, structural anomalies such as impacts to, and/or misorientation of, infrastructure elements, as well as other damage.

In another exemplary embodiment, signaling modules will sequentially transmit on one or more phases of distribution transformers. Signaling modules on other distribution transformers will receive the transmissions, providing information on path attenuation and impulse response. Comparative analysis may be used to identify anomalous differences in circuit-path characteristics, to aid in the identification and localization of faults, or anomalous conditions in grid infrastructure. In some embodiments, signaling modules transmit and receive on one, some, or all of a multi-phase system. In such an embodiment, the signaling modules may be installed at a transformer, thereby allowing the signaling modules to transmit and receive on all three phases of a three-phase system. In other embodiments, the signaling modules can simultaneously transmit and receive signals of multiple frequencies on or more phases.

In another exemplary embodiment, the signaling modules will employ digital encryption and/or spectral fragmentation of transmitted spectra to secure transmissions and/or support multi-factor authentication, where the authentication will be accomplished by using a message communicated via the secured, power line communication, or other network.

Figure 8:
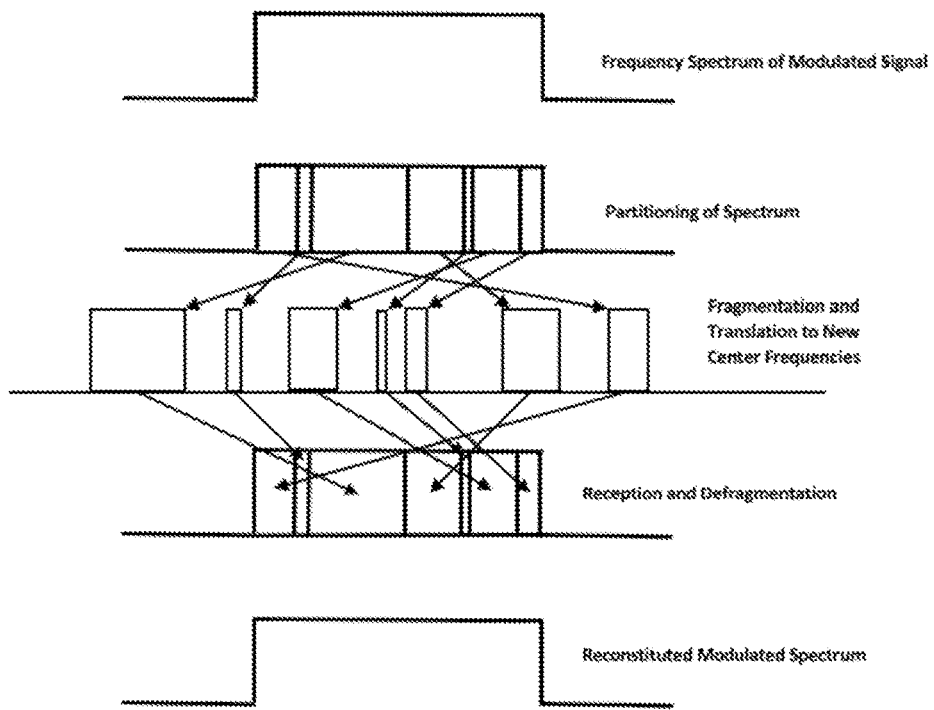
FIG. 8 illustrates an exemplary spectral fragmentation and defragmentation, according to an exemplary embodiment of the present disclosure.

In another exemplary embodiment and with reference to FIG. 8, the signal transmitted across the electrical grid may comprise components of a fragmented spectrum signal. In such an embodiment, a signal is fragmented into multiple discrete parts. One or more of the discrete parts may then be frequency-translated to be positioned at a new center-frequency. Additionally, one or more of the discrete parts are then transferred across a plurality of networks. For example, a signal may be fragmented into two parts. One part is transferred over the electrical grid and the other part is transferred over a second network, e.g., a cellular network. The two parts are received and defragmented to construct the original signal. Such an embodiment allows for greater security of the signal during transmission because, even if one part is intercepted, the part is useless without the other part and the ability to defragment. In some embodiments, reconstruction of the fragmented signal includes utilizing information related to the translated center-frequency as a way of discriminating the signal from noise. In other embodiments, the system may decrease the potential of nefarious interception of the signal by injecting superfluous noise signals into the grid to camouflage the discrete parts of the fragmented signal. Since the translated center-frequency is known to the system, it can be used discriminate the signals from injected noise.

In another exemplary embodiment of the present disclosure utilizing spectral fragmentation and defragmentation, the spectral fragmentation algorithm operating in the on-grid transmitter will partition the continuous spectrum of a modulated data message into a finite number of selected, spectral channels, residing between the grid's 60 Hz harmonics (or spanning them) and will transmit the composite signal onto the powerline channel. The spectral defragmentation algorithm in the receiver will reconstruct the original, modulated message from the acquired spectral fragments. Then, the reconstructed payload can be processed by the rest of the demodulator. To address and mitigate channel-unique signal impairments, multi-channel, adaptive equalization that would be enabled by the use of CCK preambles in the transmitted signals.

Figure 9:
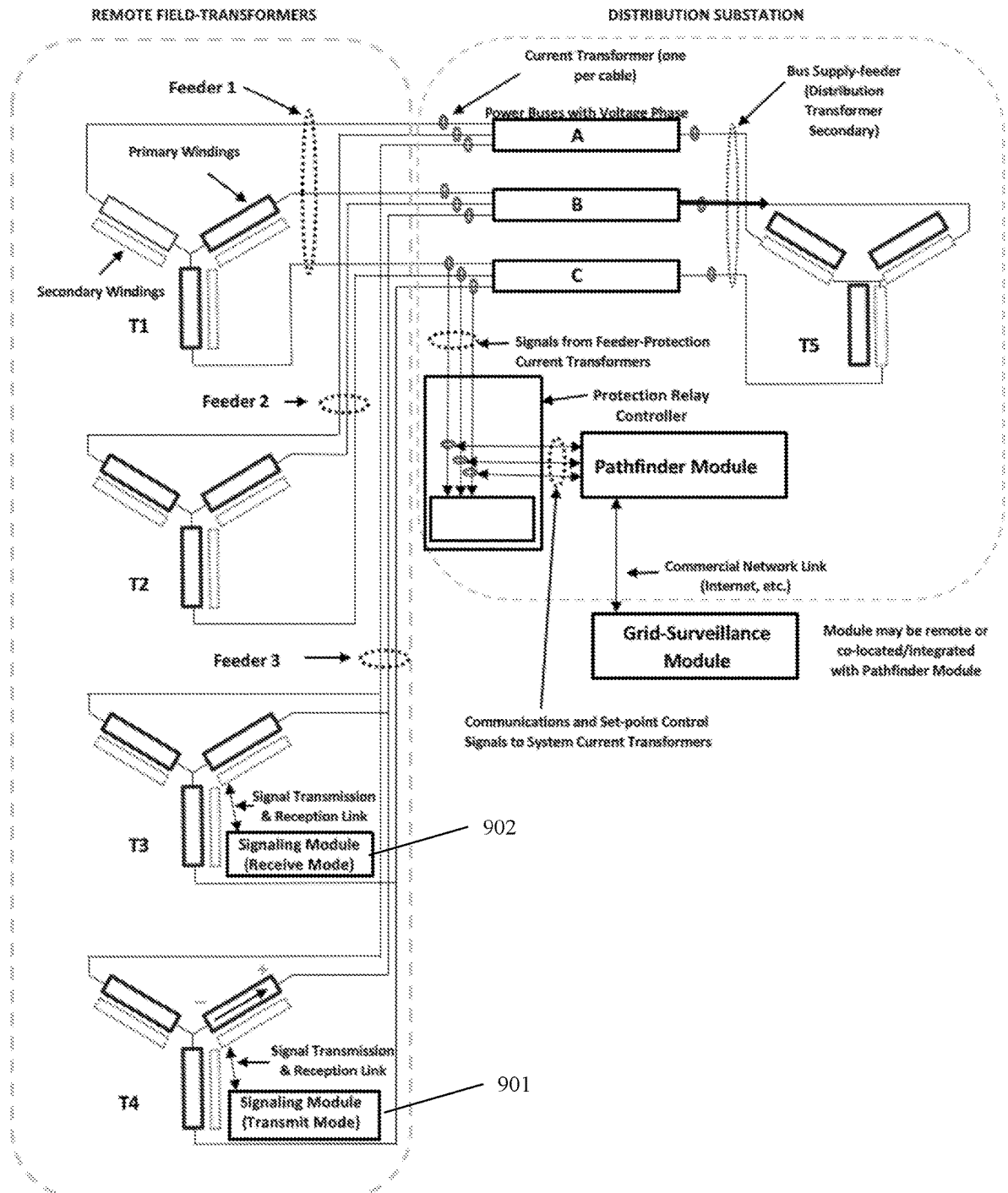
FIG. 9 illustrates an exemplary embodiment of adaptive, dynamic, set-point control into a protection-relaying controller, according to an exemplary embodiment of the present disclosure.

In another exemplary embodiment of the present disclosure and with reference to FIG. 9, signaling modules 901, 902 provide signals that are introduced into the input of protective-relaying controllers or similar equipment, to provide a means of synthetically-introducing dynamic, adaptive, set-point control, informed by the results of analyses conducted on historical data collected. Such an embodiment may be utilized to be retrofit legacy equipment. In such an embodiment, a current transformer or other means of direct injection of a modifying current or voltage may be used to introduce additional current into the leads of a relay-protection controller, causing the controller to respond to the current as an indication of excessive current in a feeder phase, or phases. This provides a means, in addition to traditional methods such as SCADA control, of causing a protective relay to appropriately trip in cases that fault current has been obscured by the presence of distributed energy resources on the grid.

In another exemplary embodiment, signaling modules, pathfinder modules, and/or Grid Surveillance Modules will be powered by means other than, or in addition to, the electrical grid. For example, each component may be connected to a solar panel, battery source, or other power source not associated with the electrical grid on which it is installed.

In another exemplary embodiment, a signaling module will inject a signal onto the service side of a distribution transformer, between the neutral and a selected phase, or between two phases. The remaining phases are monitored to determine the amount of transmitted signal appearing on them. In such an embodiment, an approximation of the division of signaling current flowing in the non-energized phases can be determined and used to provide additional grid-characteristic information to one or more signaling modules, pathfinder modules, and grid-awareness modules. For example, a high-impedance fault on the service side of the distribution transformer might be detected by such excitation.

In another exemplary embodiment, the conductors in an electrical panel are monitored, while signaling modules were used to inject signals onto conductors at various devices or appliances being supplied energy by the panel, where de-energizing circuit breakers are not an allowable means of verifying which circuit breaker is supplying a given device or appliance. For example, an industrial power panel might contain multiple, three-phase, circuit breakers, each of which supplies an individual compressor. Such an embodiment is used to determine the circuit breaker/compressor associations, without the need for removing power. Such operation could be undertaken using remotely-power signaling modules such as by battery.

In another exemplary embodiment, one or more portable signaling modules will be used to form a topological and schematic map of the grid by making transmissions from known, geographic locations. Such an embodiment provides users with the means to quickly verify feeder- and phase-identifications, in cases of uncertainty.

In another exemplary embodiment, signaling modules will be used to verify the proper phase-connection of panels and other types of devices, components, and equipment connected to the electrical grid.

The invention has been described herein using specific embodiments for the purposes of illustration only. It will be readily apparent to one of ordinary skill in the art, however, that the principles of the invention can be embodied in other ways. Therefore, the invention should not be regarded as being limited in scope to the specific embodiments disclosed herein, but instead as being fully commensurate in scope with the following claims.

We claim:

1. A method for identifying a signaling conductor in an electrical grid comprising a three-phase electrical power supply station and a number (N) of distribution feeders, wherein N is greater than or equal to three, the three-phase power supply station comprising an A phase power bus, a B phase power bus, and a C phase power bus, and the signaling conductor supplying a signal generated by a signaling module coupled to the signaling conductor, the method comprising the steps:
   determining, at the A phase power bus, a direction of current flow relative to the A phase power bus of each distribution feeder;
   determining, at the B phase power bus, a direction of current flow relative to the B phase power bus of each distribution feeder;
   determining, at the C phase power bus, a direction of current flow relative to the C phase power bus of each distribution feeder;
   analyzing current flow patterns among the N number of distribution feeders to identify one of the distribution feeders as a signaling distribution feeder;
   analyzing current flow patterns among the A phase power bus, the B phase power bus, and the C phase power bus, to identify one of the A phase power bus, the B phase power bus, or the C phase power bus as a signaling phase power bus; and
   identifying the signaling conductor, wherein the signaling conductor is common to both the identified signaling distribution feeder and the identified signaling phase power bus.

2. The method of claim 1, wherein the step of analyzing current flow patterns among the N number of distribution feeders to identify one of the distribution feeders as a signaling distribution feeder comprises the step of:
   comparing a current flow pattern of each distribution feeder to one another to identify a unique current flow pattern.

3. The method of claim 1, wherein the step of analyzing current flow patterns among the A phase power bus, the B phase power bus, and the C phase power bus, to identify one of the A phase power bus, the B phase power bus, or the C phase power bus as a signaling phase power bus comprises the step of:
   comparing a current flow pattern of the A phase power bus, the B phase power bus, and the C phase power bus to one another to identify a unique current flow pattern.

4. The method of claim 1, further comprising the step of:
   receiving, via the signaling conductor, the signal supplied by the signaling module, wherein the signal comprises geo-location information.

5. The method of claim 4, further comprising the step of:
   building a schematic connectivity and topology of the electrical grid.

6. The method of claim 4, wherein the signaling module is located at a node in the electrical grid, the node selected from the group consisting of: a transformer, a switch, a power meter, an outlet, a motor, machinery and other electrical power-consuming equipment.

7. A method for identifying a signaling conductor in an electrical grid comprising a three-phase electrical power supply station and a number (N) of distribution feeders, the three-phase power supply station comprising an A phase power bus, a B phase power bus, a C phase power bus, and a distribution transformer, and the signaling conductor supplying a signal generated by a signaling module coupled to the signaling conductor, the method comprising the steps:
   determining, at the A phase power bus, a direction of current flow relative to the A phase power bus of a first conductor coupled to a distribution transformer;
   determining, at the B phase power bus, a direction of current flow relative to the B phase power bus of a second conductor coupled to the distribution transformer;
   determining, at the C phase power bus, a direction of current flow relative to the C phase power bus of a third conductor coupled to the distribution transformer,
   identifying one of the first conductor, the second conductor, or the third conductor as a signaling conductor;
   determining, at the A phase power bus, B phase power bus, or C phase power bus, whichever is associated with the identified signaling conductor, a direction of current flow relative to that phase power bus of each distribution feeder;
   identifying the distribution feeder having a determined direction of current flow opposite that of the signaling conductor; and
   wherein the identified distribution feeder is the signaling conductor supplying the signal from the signaling module.

8. The method of claim 7, wherein the step of identifying one of the first conductor, the second conductor, or the third conductor as a signaling conductor comprises the step of:
   comparing the measured direction of current flow pattern of the first conductor, second conductor, and third conductor to one another to identify a unique current flow direction.

9. The method of claim 7, further comprising the step of:
   receiving, via the signaling conductor, the signal supplied by the signaling module, wherein the signal comprises geo-location information.

10. The method of claim 9, further comprising the step of:
   building a schematic connectivity and topology of the electrical grid.

11. The method of claim 9, wherein the signaling module is located at a node in the electrical grid, the node selected from the group consisting of: a transformer, a switch, a power meter, and an outlet.

12. A method for building an electrical grid topology of an electrical grid comprising a plurality of grid elements, the method comprising:
   sending, from a first signaling module of a plurality of signaling modules of the electrical grid, a mapping signal;
   receiving, at a second signaling module of the plurality of signaling modules, the mapping signal; and
   deriving, from the mapping signal, grid characteristics of the electrical grid;
   wherein the grid characteristics are derived from the mapping signal based on the influence that one or more of the plurality of grid elements has on the mapping signal.

13. The method of claim 12, wherein the grid characteristics further comprise the impulse response as measured between the first signaling module of the plurality of signaling modules and the second signaling module of the plurality of signaling modules.

14. The method of claim 12, wherein the mapping signal comprises an identifier associated with the first signaling module.

15. The method of claim 14, wherein the identifier comprises a preamble of one or more sequences of modulated information bits.

16. The method of claim 12, further comprising the steps of
receiving, at each of the plurality of signaling modules, the mapping signal sent by the first signaling module; and
deriving, from the mapping signal, grid characteristics of the electrical grid as detected between the first signaling module and each of the plurality of signaling modules.

17. The method of claim 12, wherein each of the plurality of signaling modules are further configured to measure characteristics of the grid element on which they are installed.

18. The method of claim 12, wherein each of the plurality signaling modules are further configured to measure aspects of its surrounding environment.

19. The method of claim 12 further comprising the step of
sending, from the first signaling module of the plurality of signaling modules, a communication signal across the electrical grid.

20. The method of claim 19, wherein the communication signal comprises a first fragmentation of a plurality of signal fragments derived from a communication, and wherein a second fragmentation of the plurality of signal fragments is sent over a network other than the electrical grid.

21. The method of claim 19, wherein the mapping signal and the communication signal are the same signal.

22. A method for detecting faults in an electrical grid comprising a plurality of grid elements, the method comprising:
sending, from a first signaling module of a plurality of signaling modules, a mapping signal;
receiving, at a second signaling module of the plurality of signaling modules, the mapping signal;
deriving, from the mapping signal, grid characteristics of the electrical grid; and comparing the derived grid characteristics of the electrical grid against historical data; wherein the grid characteristics are derived from the mapping signal based on the influence that one or more of the plurality of grid elements has on the mapping signal; and wherein a fault is detected when the derived grid characteristics of the electrical grid exceed a predetermined threshold compared to historical data.

* * * * *